(12) United States Patent
Kim

(10) Patent No.: US 11,690,225 B2
(45) Date of Patent: Jun. 27, 2023

(54) VERTICAL SEMICONDUCTOR DEVICE AND METHOD FOR FABRICATING THE SAME

(71) Applicant: SK hynix Inc., Icheon (KR)

(72) Inventor: Jin-Ha Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/585,133

(22) Filed: Jan. 26, 2022

(65) Prior Publication Data

US 2022/0149074 A1    May 12, 2022

Related U.S. Application Data

(63) Continuation of application No. 16/842,141, filed on Apr. 7, 2020, now Pat. No. 11,271,008.

(30) Foreign Application Priority Data

Nov. 29, 2019    (KR) ........................ 10-2019-0156872

(51) Int. Cl.
*H10B 43/27*    (2023.01)
*H01L 23/522*    (2006.01)
*H01L 29/08*    (2006.01)
*H01L 23/532*    (2006.01)
*H01L 21/28*    (2006.01)

(52) U.S. Cl.
CPC ........ *H10B 43/27* (2023.02); *H01L 23/5226* (2013.01); *H01L 23/53271* (2013.01); *H01L 23/53295* (2013.01); *H01L 29/0847* (2013.01); *H01L 29/40117* (2019.08)

(58) Field of Classification Search
CPC ........ H10B 43/27; H10B 43/20; H10B 43/30; H10B 43/50; H01L 23/5226; H01L 23/53271; H01L 23/53295; H01L 29/0847; H01L 29/40117; H01L 29/66833; H01L 29/792
See application file for complete search history.

(56) References Cited

U.S. PATENT DOCUMENTS

| 9,012,974 B2 | 4/2015 | Chae et al. |
| 9,666,525 B2 | 5/2017 | Kim et al. |
| 10,121,794 B2 * | 11/2018 | Gunji-Yoneoka ............................ H01L 27/11582 |
| 2015/0372005 A1 * | 12/2015 | Yon ...................... H01L 27/2436 257/314 |
| 2016/0190155 A1 * | 6/2016 | Lee ...................... H01L 27/1157 438/667 |

(Continued)

*Primary Examiner* — Jonathan Han

(57) ABSTRACT

A semiconductor device includes: an alternating stack that is disposed over a lower structure and includes gate electrodes and dielectric layers which are staked alternately; a memory stack structure that includes a channel layer extending to penetrate through the alternating stack, and a memory layer surrounding the channel layer; a source contact layer in contact with a lower outer wall of the vertical channel layer and disposed between the lower structure and the alternating stack; a source contact plug spaced apart from the memory stack structure and extending to penetrate through the alternating stack; and a sealing spacer suitable for sealing the gate electrodes and disposed between the source contact plug and the gate electrodes. The sealing spacer has an etch resistance that is different from an etch resistance of the dielectric layers.

20 Claims, 14 Drawing Sheets

(56) References Cited

U.S. PATENT DOCUMENTS

2019/0109150 A1 4/2019 Mori
2019/0326315 A1* 10/2019 Lee .................. H01L 27/11575
2020/0403033 A1* 12/2020 Lilak ................ H01L 27/11575

* cited by examiner

VERTICAL SEMICONDUCTOR DEVICE AND METHOD FOR FABRICATING THE SAME

CROSS-REFERENCE TO RELATED APPLICATION

The present application is the continuation of U.S. application Ser. No. 16/842,141 filed Apr. 7, 2020 and claims priority of Korean Patent Application No. 10-2019-0156872, filed on Nov. 29, 2019, which is incorporated herein by reference in its entirety.

BACKGROUND

1. Field

Embodiments of the present disclosure relate to a semiconductor device, and more particularly, to a method for fabricating a vertical semiconductor device.

2. Description of the Related Art

Fabrication of electronic devices such as semiconductor devices includes a gapfill process for forming a three-dimensional structure or a high aspect ratio structure. The gapfill process to form a high aspect ratio structure is performed, for example, in the fabrication of a vertical semiconductor device.

SUMMARY

Embodiments of the present disclosure are directed to a vertical semiconductor device with improved reliability, and a method for fabricating the vertical semiconductor device.

In accordance with an embodiment of the present disclosure, a semiconductor device includes: an alternating stack that is disposed over a lower structure and includes gate electrodes and dielectric layers which are staked alternately; a memory stack structure that includes a channel layer extending to penetrate through the alternating stack, and a memory layer surrounding the channel layer; a source contact layer in contact with a lower outer wall of the vertical channel layer and disposed between the lower structure and the alternating stack; a source contact plug spaced apart from the memory stack structure and extending to penetrate through the alternating stack; and a sealing spacer suitable for sealing the gate electrodes and disposed between the source contact plug and the gate electrodes, the sealing spacer having an etch resistance that is different from an etch resistance of the dielectric layers.

In accordance with another embodiment of the present disclosure, a method for fabricating a semiconductor device includes: forming a source sacrificial layer over a lower structure; forming a multi-layer stack in which dielectric layers and sacrificial layers are alternately stacked over the source sacrificial layer; forming a memory stack structure that includes a channel layer and a memory layer, the memory stack structure extending to penetrate through the multi-layer stack and the source sacrificial layer; forming a vertical contact recess that is spaced apart from the memory stack structure and extends to penetrate through the multi-layer stack and the source sacrificial layer; exposing a lower outer wall of the channel layer by selectively removing the source sacrificial layer and a lower portion of the memory layer of the memory stack structure through the vertical contact recess; forming a source contact layer that surrounds the lower outer wall of the channel layer; replacing the sacrificial layers of the multi-layer stack with gate electrodes to form an alternating stack; forming a carbon-containing spacer to seal a sidewall of the vertical contact recess over the source contact layer and the gate electrodes; and forming a source contact plug in the vertical contact recess.

In accordance with another embodiment of the present disclosure, a method for fabricating a semiconductor device includes: forming a first multi-layer stack including liner layers and a source sacrificial layer over a lower structure; forming a second multi-layer stack including dielectric layers and sacrificial layers over the first multi-layer stack; forming a vertical contact recess extending through the second multi-layer stack and the source sacrificial layer; replacing the source sacrificial layer with a source contact layer; forming a carbon-containing spacer on sidewall of the vertical contact recess; replacing the sacrificial layers with conductive layers; and forming a source contact plug in the vertical contact recess.

DETAILED DESCRIPTION

Figure 1:
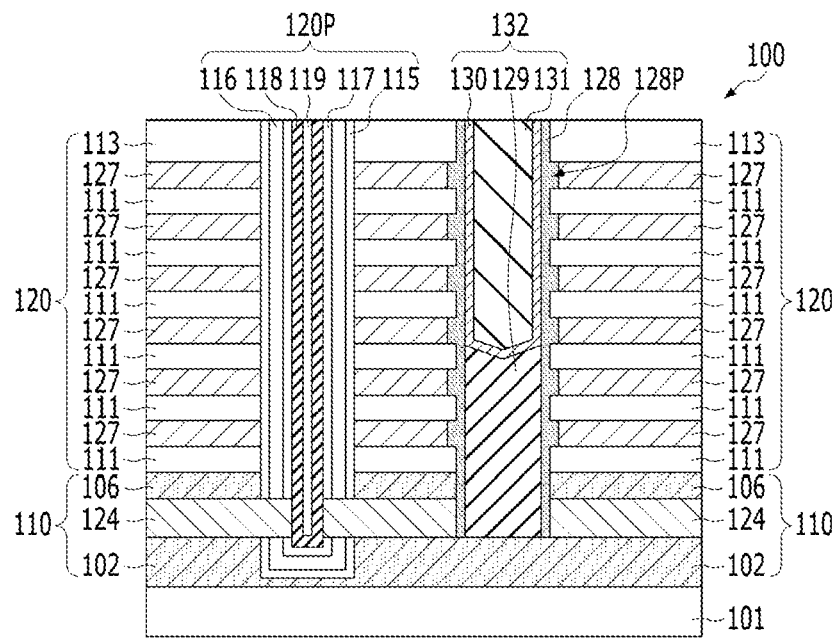
FIG. 1 is a cross-sectional view illustrating a vertical semiconductor device in accordance with an embodiment of the present disclosure.

Embodiments of the present disclosure will be described below in more detail with reference to the accompanying drawings. Embodiments of the present disclosure may, however, be implemented in different forms and should not be construed as limited to the embodiments set forth herein. Rather, these embodiments are provided so that this disclosure will be thorough and complete, and will fully convey the scope of various embodiments of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a vertical semiconductor device 100 in accordance with an embodiment of the present disclosure.

Referring to FIG. 1, the vertical semiconductor device 100 may be positioned over a lower structure 101, and the vertical semiconductor device 100 may include an alternating stack 120 in which dielectric layers 111 and gate electrodes 127 are alternately stacked, a memory stack structure 120P including a channel layer 118 extending to penetrate the alternating stack 120 and a stack of layers (or a memory layer) 115, 116, and 117 surrounding the channel layer 118, a source contact layer 124 disposed between the lower structure 101 and the alternating stack 120 while contacting an outer wall of a bottom portion of the channel layer 118, a source contact plug 132 spaced apart from the memory stack structure 120P and extending through the alternating stack 120, and a sealing spacer 128 having a different etch resistance from that of the dielectric layers 111 while sealing an outer wall of the source contact plug 132. The sealing spacer 128 may seal the gate electrodes 127 and be disposed between the source contact plug 132 and the gate electrodes 127, and may have different etch resistance from the dielectric layers 111. The outer wall of the source contact plug 132 may be surrounded by the sealing spacer 128, and the sealing spacer 128 may vertically extend to cover the gate electrodes 127, the dielectric layers 111, and the source contact layer 124.

The lower structure 101 may include a material suitable for semiconductor processing. The lower structure 101 may include a substrate, and the substrate may include a semiconductor substrate. For example, the lower structure 101 may be a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multi-layer thereof. The lower structure 101 may include other semiconductor materials, such as germanium. The lower structure 101 may include a III/V-group semiconductor substrate, such as a compound semiconductor substrate, e.g., GaAs. The lower structure 101 may include a Silicon-On-Insulator (SOI) substrate. Although not shown, according to another embodiment of the present disclosure, the lower structure 101 may include a substrate, at least one control circuit formed over the substrate, and a multi-layer metal line.

A multi-layer stack structure may be formed over the lower structure 101. The multi-layer stack structure may include a source-level stack 110 and an alternating stack 120 over the source-level stack 110. The source-level stack 110 may have a height lower than a height of the alternating stack 120.

The source-level stack 110 may include a lower source layer 102, a source contact layer 124, and an upper source layer 106. The source contact layer 124 may be formed over the lower source layer 102, and the upper source layer 106 may be formed over the source contact layer 124. The source contact layer 124 may be disposed between the lower source layer 102 and the upper source layer 106. The lower source layer 102, the upper source layer 106, and the source contact layer 124 may include a semiconductor material. The lower source layer 102, the upper source layer 106, and the source contact layer 124 may include polysilicon. The source contact layer 124 may include polysilicon doped with phosphorus (P). The source contact layer 124 may include polysilicon containing carbon. The source contact layer 124 may include a stack of phosphorus-doped polysilicon (SiP) and carbon-doped polysilicon (SiC). The lower source layer 102 and the upper source layer 106 may include undoped polysilicon or doped polysilicon.

The alternating stack 120 may be referred to as a memory cell stack or a memory cell string. The alternating stack 120 may have a structure in which a plurality of dielectric layers 111 and a plurality of gate electrodes 127 are alternately stacked. The top dielectric layer 113 among the dielectric layers 111 may be thicker than the dielectric layers 111 at lower levels than the top dielectric layer 113. The dielectric layers 111 may include silicon oxide. The gate electrodes 127 may include a low-resistance material. The gate electrodes 127 may include a metal-based material. The gate electrodes 127 may include metal, metal silicide, metal nitride, or a combination thereof. For example, the metal may include nickel, cobalt, platinum, titanium, tantalum, or tungsten. The metal silicide may include nickel silicide, cobalt silicide, platinum silicide, titanium silicide, tantalum silicide, or tungsten silicide. The gate electrodes 127 may include a stack of titanium nitride and tungsten. The ends of the gate electrodes 127 may have a shape that is horizontally recessed from the ends of the dielectric layers 111.

The memory stack structure 120P may extend vertically to penetrate through the alternating stack 120. The memory stack structure 120P may have a pillar shape. The memory stack structure 120P may include a blocking layer 115, a charge trapping layer 116, a tunnel dielectric layer 117, a channel layer 118, and a core dielectric layer 119. The memory stack structure 120P may include an ONOP structure. The ONOP structure may include a stack of oxide, nitride, oxide, and polysilicon layers. The blocking layer 115 and the tunnel dielectric layer 117 may include an oxide, and the charge trapping layer 116 may include a nitride, and the channel layer 118 may include polysilicon. According to an embodiment of the present disclosure, the blocking layer 115 may include a high dielectric material, and the high dielectric material may include aluminum oxide or hafnium oxide. The channel layer 118 may have a cylindrical shape having an inner space. The tunnel dielectric layer 117 may be formed on the outer wall of the channel layer 118, and the charge trapping layer 116 may be formed on the outer wall of the tunnel dielectric layer 117. The blocking layer 115 may be formed on the outer wall of the charge trapping layer 116. The inner space of the channel layer 118 may be substantially completely filled with the core dielectric layer 119. The core dielectric layer 119 may include silicon oxide or silicon nitride. The stack of the blocking layer 115, the charge trapping layer 116, and the tunnel dielectric layer 117 may be referred to as a memory layer 115/116/117, which may be of an annular shape surrounding the outer wall of the channel layer 118.

The source contact layer 124 may selectively horizontally penetrate through a bottom portion of the memory layer 115/116/117 of the memory stack structure 120P to contact the lower outer wall of the channel layer 118. The source contact layer 124 may have a shape surrounding the lower outer wall of the channel layer 118.

The source contact plug 132 may include a stack of the silicon-containing material (or the silicon-containing material pattern) 129 and the metal-containing material (or the metal-containing material pattern) 131, and may further include a barrier material (or a barrier material layer) 130 between the silicon-containing material 129 and the metal-containing material 131. The silicon-containing material 129 may include polysilicon, and the metal-containing material 131 may include tungsten. The barrier material 130 may include titanium nitride. According to another embodiment of the present disclosure, the source contact plug 132 may be formed of tungsten alone. The lower portion of the source contact plug 132 may be coupled to the lower source layer 102 of the source-level stack 110.

The sealing spacer 128 may be formed between the source contact plug 132 and the gate electrodes 127. The sealing spacer 128 may extend to be formed between the dielectric layers 111 and 113 and the source contact plug 132. For example, the sealing spacer 128 may extend along the vertical direction in which the gate electrodes 127 and the dielectric layers 111 and 113 of the alternating stack 120 are stacked, such that the sealing spacer 128 may be disposed between the source contact plug 132 and the dielectric layers 111 and 113. The sealing spacer 128 may be continuous in the stacking direction of the alternating stack 120. The sealing spacer 128 may include one or more protrusions 128P, and the protrusions 128P may be coupled to the ends (e.g., ends 127R in FIG. 10) of the gate electrodes 127, respectively. The protrusions 128P of the sealing spacer 128 may extend in the horizontal direction that is perpendicular to the stacking direction of the alternating stack 120. The protrusions 128P of the sealing spacer 128 may seal the recessed ends of the gate electrodes 127. The sealing spacer 128 may seal the sides of the dielectric layers 111 and 113. The sealing spacer 128 may seal the sides of the source contact layer 124. The sealing spacer 128 may seal the side of the upper source layer 106 and may not seal a portion of the surface of the lower source layer 102. The sealing spacer 128 may substantially fully surround the outer wall of the source contact plug 132.

The sealing spacer 128 may include a silicon oxide-based material. The sealing spacer 128 may include a low dielectric material. The low dielectric material may have a lower dielectric constant than silicon nitride. The sealing spacer 128 may have a dielectric constant lower than approximately 7. The sealing spacer 128 may be thinner than the dielectric layers 111 and 113 and the gate electrodes 127. In the embodiment shown in FIG. 1, the sealing spacer 128 may have a thickness in the horizontal direction smaller than a thickness of each of the dielectric layers 111 and 113 and the gate electrodes 127 in the vertical direction. For example, a thickness of the protrusion 128P of the sealing spacer 128 in the horizontal direction may be smaller than a thickness of each of the dielectric layers 111 and 113 and the gate electrodes 127 in the vertical direction. The sealing spacer 128 may be a layer of a material that is different from those of the dielectric layers 111 and 113. The sealing spacer 128 may be a layer of a material that is different from those of the gate electrodes 127. The sealing spacer 128 may include a material having a high wet-etch resistance. The wet-etch resistance of the sealing spacer 128 may be obtained from carbon. The sealing spacer 128 may include a carbon-containing material, and the dielectric layers 111 and 113 may be a carbon-free material. The dielectric layers 111 and 113 may be formed of carbon-free silicon oxide, and the sealing spacer 128 may be formed of carbon-containing silicon oxide. For example, the dielectric layers 111 and 113 may be formed of $SiO_2$, and the sealing spacer 128 may be formed of SiCO. SiCO may be more etch resistant than $SiO_2$. The carbon content of SiCO may be less than the content of silicon and the content of oxygen. For example, SiCO may have a composition ratio of silicon (Si) 34 at %, oxygen 40 at %, and carbon 17 at %. SiCO may have a lower dielectric constant than silicon nitride ($Si_3N_4$).

The sealing spacer 128 may be formed to have a thickness of approximately 50 Å to 100 Å. For example, a protrusion 128P of the sealing spacer 128 may have a thickness in a range from 50 Å to 100 Å in the horizontal direction with respect to the orientation of FIG. 1. The high wet-etch resistance of SiCO may reduce the thickness of the sealing spacer 128. Specifically, the high wet-etch resistance of SiCO may prevent the sealing spacer 128 from being significantly etched when one or more cleaning processes are performed. Thus, even when the sealing spacer 128 is formed to have a relatively small thickness and one or more cleaning process are performed on the sealing spacer 128, the thickness of the sealing spacer 128 may remain sufficiently thick to substantially prevent Grown Bad Blocks (GBB) defects. As a result, the size of the source contact plug 132 for separating cell blocks may be reduced, which eventually reduces the chip size. In addition, even when a vertical contact recess in which the source contact plug 132 is formed has a relatively small size (e.g., a width in the horizontal direction of FIG. 1), because the sealing spacer 128 may formed to have a relatively small thickness, the vertical contact recess may be filled with the source contact plug 132 without voids.

According to another embodiment of the present disclosure, the sealing spacer 128 may include SiCN, SiBCN, SiBN, or a combination thereof. The wet-etch resistance of the sealing spacer 128 may be obtained by carbon, nitrogen, boron, or a combination thereof.

According to another embodiment of the present disclosure, the sealing spacer 128 may include a stack of one or more carbon-free silicon oxide layers and one or more carbon-containing silicon oxide layers. For example, after a carbon-free silicon oxide layer (e.g., $SiO_2$ layer) is thinly deposited, a carbon-containing silicon oxide layer (e.g., SiCO layer) may be deposited over the carbon-free silicon oxide layer. As a result, the carbon-containing silicon oxide layer may be in direct contact with the source contact plug 132.

FIGS. 2, 3, 4, 5, 6, 7, 8, 9, 10, 11, 12, 13, and 14 are cross-sectional views illustrating a method for fabricating a vertical semiconductor device in accordance with an embodiment of the present disclosure. For example, FIGS. 2 to 14 show a method for fabricating the vertical semiconductor device 100 of FIG. 1.

Figure 2:
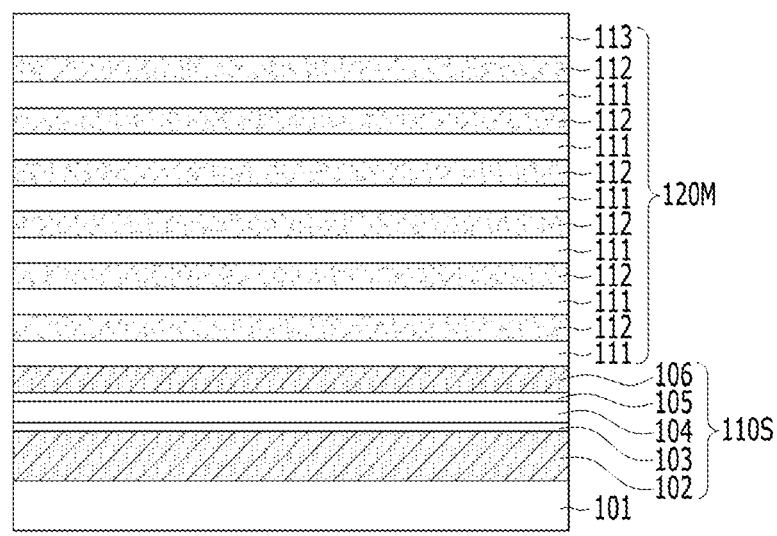
FIGS. 2 to 14 are cross-sectional views illustrating a method for fabricating a vertical semiconductor device in accordance with an embodiment of the present disclosure.

Referring to FIG. 2, a first multi-layer stack 110S may be formed over the lower structure 101. A second multi-layer stack 120M may be formed over the first multi-layer stack 110S.

The first multi-layer stack 110S may be a stack including a lower source layer 102, a first liner layer 103, a source sacrificial layer 104, a second liner layer 105, and an upper source layer 106. According to the embodiment shown in FIG. 2, the first multi-layer stack 110S may have the source sacrificial layer 104 formed between the lower source layer 103 and the upper source layer 106, the first liner layer 103 formed between the source sacrificial layer 104 and the lower source layer 102, and the second liner layer 105 formed between the source sacrificial layer 104 and the upper source layer 106. The lower source layer 102, the upper source layer 106, and the source sacrificial layer 104 may include the same material, and the first and second liner layers 103 and 105 may include a material that is different from the materials of the lower source layer 102, the upper source layer 106, and the source sacrificial layer 104.

The lower source layer 102 and the upper source layer 106 may have an etch selectivity with respect to the first and second liner layers 103 and 105. The lower source layer 102, the upper source layer 106, and the source sacrificial layer 104 may include a semiconductor material, and the first and second liner layers 103 and 105 may include a dielectric material. The lower source layer 102, the upper source layer 106, and the source sacrificial layer 104 may include polysilicon, and the first and second liner layers 103 and 105 may include silicon oxide. The first and second liner layers 103 and 105 may be thinner than the lower source layer 102, the upper source layer 106, and the source sacrificial layer 104. For example, the lower source layer 102 and the upper source layer 106 may each have a thickness of approximately 150 nm in the vertical direction of FIG. 2, and the first and second liner layers 103 and 105 may each have a thickness of approximately 8 nm in the vertical direction.

The thickness of the source sacrificial layer 104 may be the same as or thinner than the lower source layer 102 and the upper source layer 106.

The first and second liner layers 103 and 105 may protect the lower source layer 102 and the upper source layer 106 while the source sacrificial layer 104 is removed.

The first and second liner layers 103 and 105 may include a silicon oxide-based material. One or both of the first liner layer 103 and the second liner layer 105 may include $SiO_2$, SiCO, or a combination thereof.

The second multi-layer stack 120M may be thicker than the first multi-layer stack 110S. The second multi-layer stack 120M may include a dielectric layer 111 and a sacrificial layer 112. The second multi-layer stack 120M may include an alternating stack of the dielectric layer 111 and the sacrificial layer 112. The dielectric layer 111 and the sacrificial layer 112 may be alternately stacked several times. The dielectric layer 111 and the sacrificial layer 112 may include different materials. The dielectric layer 111 may have an etch selectivity with respect to the sacrificial layer 112. The dielectric layer 111 may include silicon oxide, and the sacrificial layer 112 may include silicon nitride. The dielectric layer 111 and the sacrificial layer 112 may have substantially the same thickness. The dielectric layer 111 and the sacrificial layer 112 may be thicker than the first and second liner layers 103 and 105, and the dielectric layer 111 and the sacrificial layer 112 may be thinner than the lower source layer 102 and the upper source layer 106.

The dielectric layer 111 and the sacrificial layer 112 may be formed using Chemical Vapor Deposition (CVD) or Atomic Layer Deposition (ALD). An uppermost dielectric layer (or a top dielectric layer) 113 formed at a top portion of the second multi-layer stack 120M may be attacked and damaged by the subsequent processes. Therefore, the top dielectric layer 113 may be formed thicker than the other dielectric layers 111 below the top dielectric layer 113. The top dielectric layer 113 may be used as an etch barrier.

The first and second liner layers 103 and 105 may be thinner than the dielectric layers 111 and 113, the lower source layer 102, the upper source layer 106, and the source sacrificial layer 104. The first and second liner layers 103 and 105 may include a material that is different from those of the dielectric layers 111 and 113. The first and second liner layers 103 and 105 may include a material having a high wet-etch resistance. The wet-etch resistance of the first and second liner layers 103 and 105 may be obtained from carbon. The first and second liner layers 103 and 105 may include a carbon-containing material, and the dielectric layers 111 and 113 may include a carbon-free material. The dielectric layers 111 and 113 may include carbon-free silicon oxide, and the first and second liner layers 103 and 105 may include carbon-containing silicon oxide. For example, the dielectric layers 111 and 113 may be $SiO_2$, and the first and second liner layers 103 and 105 may be SiCO. SiCO may be more etch-resistant than $SiO_2$. The carbon content of SiCO may be less than the silicon content and the oxygen content. For example, SiCO may have a composition ratio of silicon (Si) 34 at %, oxygen 40 at %, and carbon 17 at %.

The first and second liner layers 103 and 105 may be formed to have a thickness of approximately 50 Å to 100 Å. For example, each of the first and second liner layers 103 and 105 may have a thickness in a range from 50 Å to 100 Å in the vertical direction with respect to the orientation of FIG. 2. The high wet-etch resistance of SiCO may reduce the thickness of the first and second liner layers 103 and 105. For example, the high wet-etch resistance of SiCO may prevent the first and second liner layers 103 and 105 from being significantly etched while the source sacrificial layer 104 is removed in a wet-etch process. Thus, even when each of the first and second liner layers 103 and 105 is formed to have a relatively small thickness, the first and second liner layers 103 and 105 may protect the lower source layer 102 and the upper source layer 106, respectively, while the source sacrificial layer 104 is removed in the wet-etch process. As a result, the height of the first multi-layer stack 110S including the first and second liner layers 103 and 105 may be reduced.

According to another embodiment of the present disclosure, the first and second liner layers 103 and 105 may include nitrogen, boron, or a combination thereof in addition to carbon.

According to another embodiment of the present disclosure, the first and second liner layers 103 and 105 may include a stack of one or more carbon-free silicon oxide layers and one or more carbon-containing silicon oxide layers. For example, after a carbon-free silicon oxide layer is thinly deposited, a carbon-containing silicon oxide layer may be deposited over the carbon-free silicon oxide layer.

According to another embodiment of the present disclosure, the first liner layer 103 may be formed of $SiO_2$, and the second liner layer 105 may be formed of SiCO.

According to another embodiment of the present disclosure, the stack of the second liner layer 105 and the upper source layer 106 may be replaced with one layer of SiCO.

As described above, when one or both of the first liner layer 103 and the second liner layer 105 is formed of SiCO and when the stack of the second liner layer 105 and the upper source layer 106 is replaced by one layer of SiCO, not only there is no significant loss of thickness by a wet-etch chemical, but also breakdown voltage (BV) characteristics with the source contact plug may be improved due to a small loss in the thickness of SiCO while a subsequent process of forming horizontal contact recesses and a process of expanding the horizontal contact recesses (i.e., a dry etch process and a wet-etch process for removing a blocking layer, a charge trapping layer, and a tunnel dielectric layer) are performed.

Figure 3:
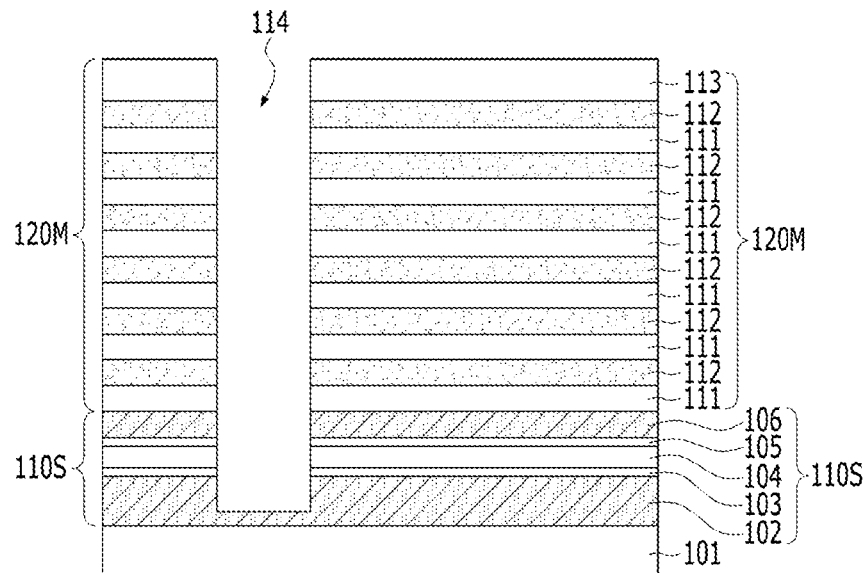

Referring to FIG. 3, a vertical opening 114 may be formed. The vertical opening 114 may be formed by etching the second multi-layer stack 120M and partially etching the first multi-layer stack 110S sequentially.

The vertical opening 114 may be formed substantially perpendicular to the surface (e.g., a top surface) of the lower structure 101. The vertical opening 114 may be shaped to penetrate through the second multi-layer stack 120M and to partially penetrate through the first multi-layer stack 110S. Although not shown, from the perspective of a plan view, a plurality of vertical openings 114 may be formed in a hole array structure. When the vertical openings 114 are formed, the surface of the lower structure 101 may not be exposed. For example, a portion of the lower source layer 102 may remain below the bottom surface of the vertical opening 114. The vertical opening 114 may be referred to as a vertical recess, a through hole, a vertical hole, or a channel hole.

Figure 4:
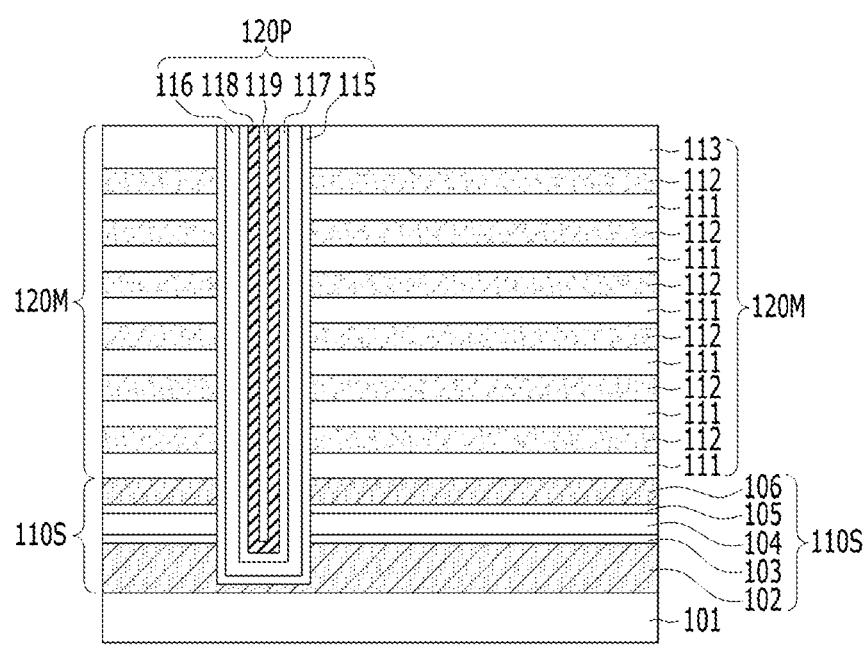

Referring to FIG. 4, a memory stack structure 120P may be formed in a vertical opening 114. The memory stack structure 120P may have a pillar shape filling the vertical opening 114.

The memory stack structure 120P may include a blocking layer 115, a charge trapping layer 116, a tunnel dielectric layer 117, and a channel layer 118. The memory stack structure 120P may include an ONOP structure. The ONOP structure may include a stack of an oxide layer, a nitride layer, an oxide layer, and a polysilicon layer. The blocking layer 115 and the tunnel dielectric layer 117 may include an oxide, and the charge trapping layer 116 may include a nitride, and the channel layer 118 may include a polysilicon layer. According to an embodiment of the present disclosure, the blocking layer 115 may include a high dielectric material, and the high dielectric material may include aluminum oxide or hafnium oxide.

The channel layer 118 may be a cylinder shape having an inner space. The tunnel dielectric layer 117 may be formed on the outer wall of the channel layer 118, and the charge trapping layer 116 may be formed on the outer wall of the tunnel dielectric layer 117. The blocking layer 115 may be formed on an outer wall of the charge trapping layer 116.

The memory stack structure 120P may further include a core dielectric layer 119. The inner space of the channel layer 118 may be substantially completely filled with the core dielectric layer 119. The core dielectric layer 119 may include silicon oxide or silicon nitride. Although not illustrated, a conductive pad coupled to an upper end portion of the channel layer 118 may be further formed after the core dielectric layer 119 is recessed.

The stack of the blocking layer 115, the charge trapping layer 116, and the tunnel dielectric layer 117 may be referred to as a memory layer, and the charge trapping layer 116 may be referred to as a memory material layer.

Figure 5:
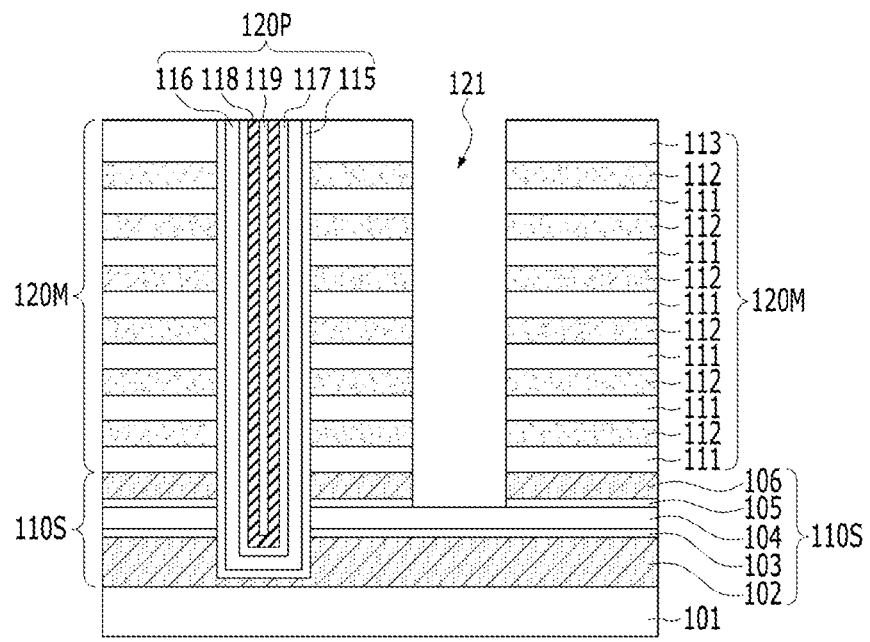

Referring to FIG. 5, a vertical contact recess 121 may be formed. The vertical contact recess 121 may be formed to be spaced apart from the memory stack structure 120P. The vertical contact recess 121 may be formed by etching the second multi-layer stack 120M, and the vertical contact recess 121 may extend downward to a portion of the first multi-layer stack 110S. The bottom portion of the vertical contact recess 121 may penetrate through the upper source layer 106 and the second liner layer 105. The etch process for forming the vertical contact recess 121 may stop on the upper surface of the source sacrificial layer 104. According to another embodiment of the present disclosure, the top surface of the source sacrificial layer 104 may be partially recessed while the vertical contact recess 121 is formed. The vertical contact recess 121 may be referred to as a slit or trench. From the perspective of a top view, the vertical contact recess 121 may have a line shape extending in one direction. The vertical contact recess 121 may have a high aspect ratio perpendicular to the surface of the lower structure 101.

Figure 6:
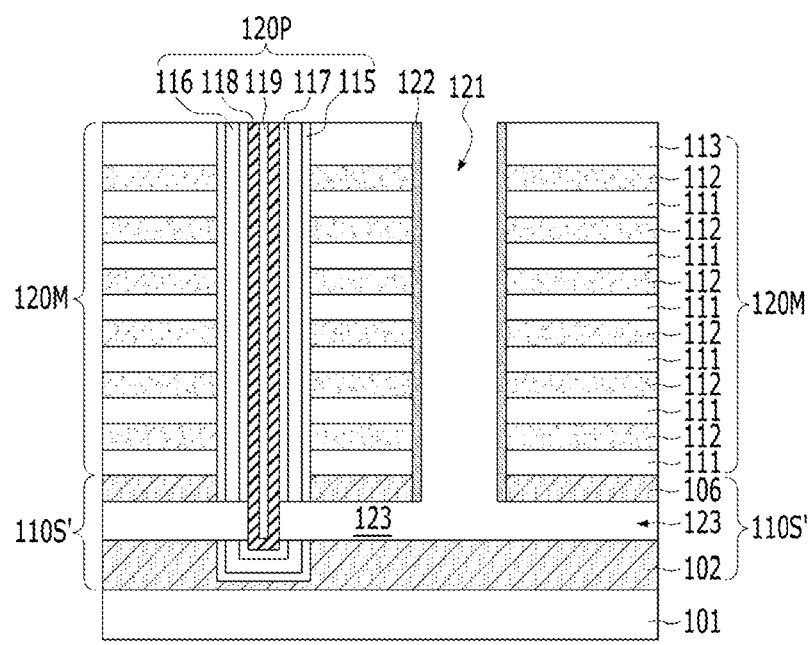

Referring to FIG. 6, a sacrificial sealing layer 122 may be formed on the sidewall of the vertical contact recess 121. The sacrificial sealing layer 122 may be formed as a spacer on the sidewall of the vertical contact recess 121. The sacrificial sealing layer 122 may be formed by conformally forming a sacrificial sealing material layer and then performing a cutting process on the sacrificial sealing material layer.

The sacrificial sealing material layer for forming the sacrificial sealing layer 122 may include an oxide, a nitride, or a combination thereof. For example, the sacrificial sealing material layer for the sacrificial sealing layer 122 may include a first sealing layer, a second sealing layer, and a third sealing layer. The first sealing layer and the third sealing layer may include the same material, and the second sealing layer may include a material that is different from the materials of the first and third sealing layers. The second sealing layer may have an etch selectivity with respect to the first and third sealing layers. The first sealing layer and the third sealing layer may include an oxide, and the second sealing layer may include a nitride. Thus, the sacrificial sealing layer 122 may include a NON structure. The NON structure may refer to a stack of a nitride, an oxide, and a nitride. The sacrificial sealing material layer may cover the bottom surface and sidewalls of the vertical contact recess 121.

The sacrificial sealing material layer may be cut, and as a result, the sacrificial sealing layer 122 may be formed. The cutting process of the sacrificial sealing material layer may include an etch process, and the surface (e.g., the top surface) of the source sacrificial layer 104 may be exposed by the cutting process. After the cutting process, the sacrificial sealing material layer may remain as a spacer-type sacrificial sealing layer 122 on the sidewall of the vertical contact recess 121. The cutting process of the sacrificial sealing material layer may include an etch-back process.

Subsequently, the source sacrificial layer 104 may be selectively removed through the vertical contact recess 121. As a result, the horizontal contact recess 123 may be formed. The vertical contact recess 121 and the horizontal contact recess 123 may be coupled to each other. The horizontal contact recess 123 may be formed between the first liner layer 103 and the second liner layer 105 by removing the source sacrificial layer 104 through a dip-out process. The horizontal contact recess 123 may be parallel to the surface of the lower structure 101. When the source sacrificial layer 104 is removed, the first and second liner layers 103 and 105 may have etch selectivity with respect to the source sacrificial layer 104, and thus remain without being significantly etched. The horizontal contact recess 123 may be formed in the first multi-layer stack 110S. When the source sacrificial layer 104 is removed, the lower source layer 102 and the upper source layer 106 may not be removed. A wet-etch process may be applied to remove the source sacrificial layer 104. Since the source sacrificial layer 104 includes a polysilicon layer, the wet-etch process may include a chemical capable of etching the polysilicon layer.

A portion of the horizontal contact recess 123 may expose the lower sidewall of the memory stack structure 120P. The outer wall of the memory stack structure 120P may be a blocking layer 115, and the blocking layer 115 of the memory stack structure 120P may be exposed by the horizontal contact recess 123. Since the blocking layer 115 includes an oxide, the blocking layer 115 of the memory stack structure 120P may have etch selectivity with respect to the source sacrificial layer 104 and may not be etched while the source sacrificial layer 104 is removed. From the perspective of a top view, the horizontal contact recess 123 may have an annular shape surrounding the lower sidewall of the memory stack structure 120P. The horizontal contact recess 123 may be referred to as a source-level air gap.

Subsequently, the first and second liner layers 103 and 105 may be removed. As a result, the height of the horizontal contact recess 123 may increase in the vertical direction with respect to the orientation of FIG. 6. The horizontal contact recess 123 having the extended height may directly contact the lower source layer 102 and the upper source layer 106.

While the first and second liner layers 103 and 105 are removed, the blocking layer 115 of the memory stack structure 120P may be removed. Thus, the charge trapping layer 116 of the memory stack structure 120P may be exposed. A wet-etch process may be applied to remove the first and second liner layers 103 and 105. The wet-etch process may include a chemical that may selectively remove silicon oxide.

Subsequently, the charge trapping layer 116 of the memory stack structure 120P may be removed through the vertical contact recess 121 and the horizontal contact recess 123. The charge trapping layer 116 may be removed by a wet-etch process. When the charge trapping layer 116 includes a nitride, the wet-etch process may include a chemical capable of etching the nitride.

By removing the charge trapping layer 116, the horizontal length of the horizontal contact recess 123 may be increased.

Subsequently, the tunnel dielectric layer 117 of the memory stack structure 120P may be removed through the vertical contact recess 121 and the horizontal contact recess 123. The tunnel dielectric layer 117 may be removed by a wet-etch process. When the tunnel dielectric layer 117 includes an oxide, the wet-etch process may include a chemical capable of etching the oxide.

By removing the tunnel dielectric layer 117, the horizontal length of the horizontal contact recess 123 may be increased.

As described above, when the process of removing the source sacrificial layer 104, the process of removing the first and second liner layers 103 and 105, the process of removing the blocking layer 115, the process of removing the charge trapping layer 116, the process of removing the tunnel dielectric layer 117 are performed, the sacrificial sealing layer 122 may serve as an etch barrier that protects the dielectric layers 111 and 113 and the sacrificial layer 112.

A lower outer wall of the channel layer 118 of the memory stack structure 120P may be exposed by the process of expanding the horizontal contact recess 123. For example, an annular air gap may expose the lower outer wall of the channel layer 118. The annular air gap may refer to portions from which the blocking layer 115, the charge trapping layer 116, and the tunnel dielectric layer 117 are removed.

The first multi-layer stack in which one or more horizontal contact recesses 123 are formed may be denoted by 110S'.

By the series of the processes illustrated in FIGS. 2 to 6, a contact opening penetrating through the first multi-layer stack 110S' and the second multi-layer stack 120M may be formed. The contact opening may include a vertical contact recess 121 and a horizontal contact recess 123. The horizontal contact recess 123 may extend from the vertical contact recess 121. The vertical contact recess 121 may extend in a direction (e.g., a vertical direction) perpendicular to the surface (e.g., the top surface) of the lower structure 101, and the horizontal contact recess 123 may extend in a direction (e.g., a horizontal direction) parallel to the surface of the lower structure 101. The horizontal contact recess 123 may have a high aspect ratio that is parallel to the surface of the lower structure 101. For example, the horizontal contact recess 123 may have a relatively high ratio of the width in the horizontal direction over the height in the vertical direction. The vertical contact recess 121 may have a high aspect ratio perpendicular to the lower structure 101. For example, the vertical contact recess 121 may have a relatively high ratio of the height in the vertical direction over the width in the horizontal direction.

Figure 7:
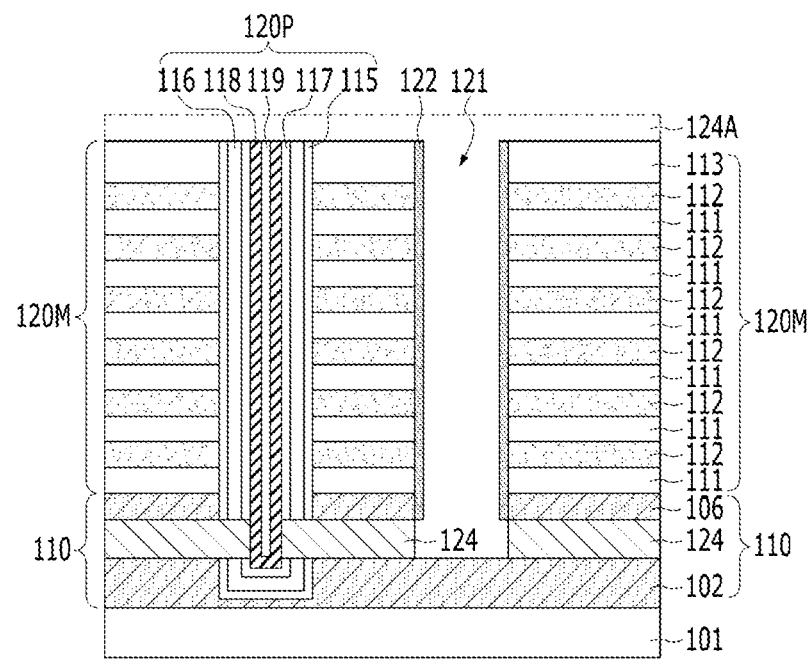

Referring to FIG. 7, a source contact material 124A may be formed to fill a contact opening, for example, the vertical recess 121 and the horizontal contact recess 123. The source contact material 124A may include a conductive material. The source contact material 124A may include polysilicon. The source contact material 124A may include polysilicon which is doped with phosphorus (P). The source contact material 124A may include polysilicon containing carbon. The source contact material 124A may include a stack of phosphorus-doped polysilicon (SiP) and carbon-doped polysilicon (SiC).

Subsequently, the source contact material 124A may be selectively removed. The process of selectively removing the source contact material 124A may include a recessing process, and the recessing process may include a wet-etch process. The source contact layer 124 may be formed in the horizontal contact recess 123 by performing the wet-etching process on the source contact material 124A. The source contact layer 124 may fill the horizontal contact recess 123. For example, the source contact material 124A may be etched using the sidewalls of the sacrificial sealing layer 122 to make the source contact layer 124 self-aligned with the sidewalls of the sacrificial sealing layer 122. As a result, the bottom surface of the vertical recess 121 may directly contact the lower source layer 102. The source contact layer 124 may remain in the horizontal contact recess 123, and the source contact layer 124 may not remain in the vertical recess 121.

Although not illustrated, the source contact layer 124 may be exposed to an oxidation process subsequently. The oxidation process may include a dry oxidation process or a wet oxidation process. An edge of the source contact layer 124 may be oxidized by an oxidation process. As a result, a barrier oxide (not shown) may be formed at the edge of the source contact layer 124 (that is, the portion exposed by the bottom portion of the vertical contact recess 121). The barrier oxide may include silicon oxide. The barrier oxide may protect the source contact layer 124 from being attacked during the subsequent process.

The first multi-layer stack 110S' in which the source contact layer 124 is formed may be simply referred to as a source-level stack 110. The source-level stack 110 may be disposed below the second multi-layer stack 120M, and the source contact layer 124 may be directly coupled to the channel layer 118 of the memory stack structure 120P.

As described above, the source-level stack 110 which is formed by a series of the processes of replacing the source sacrificial layer 104 with the source contact layer 124 may have a structure in which the source contact layer 124 is embedded.

Figure 8:
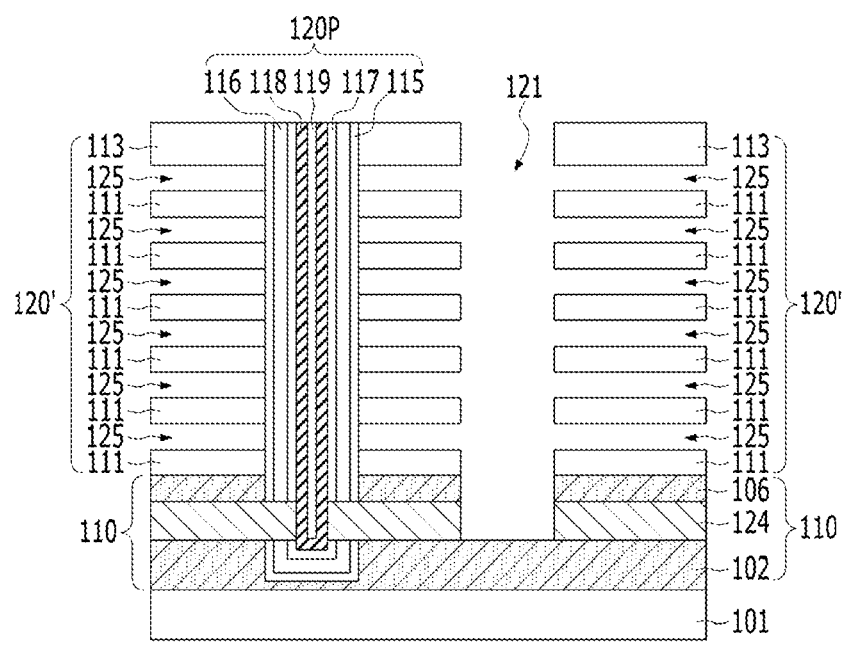
Figure 9:
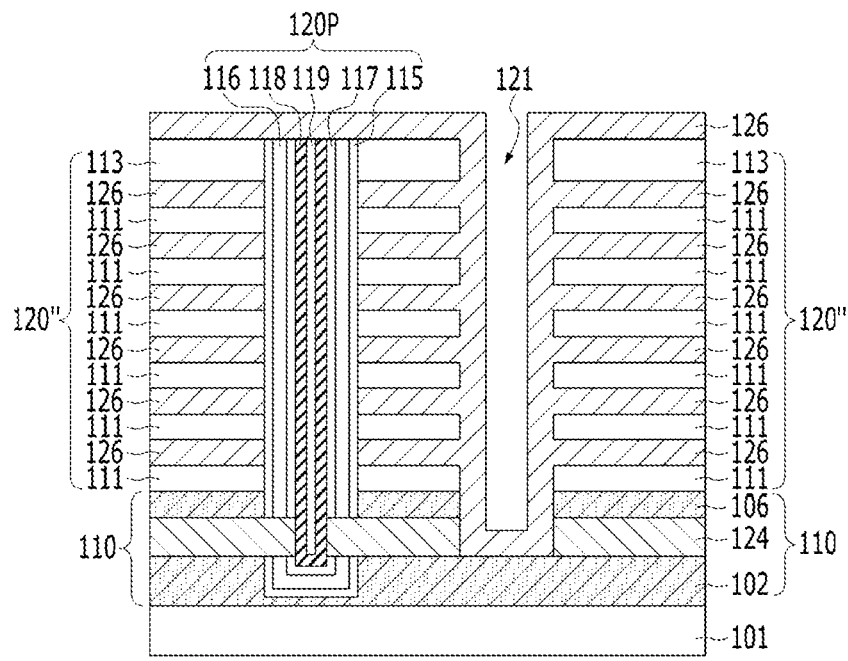
Figure 10:
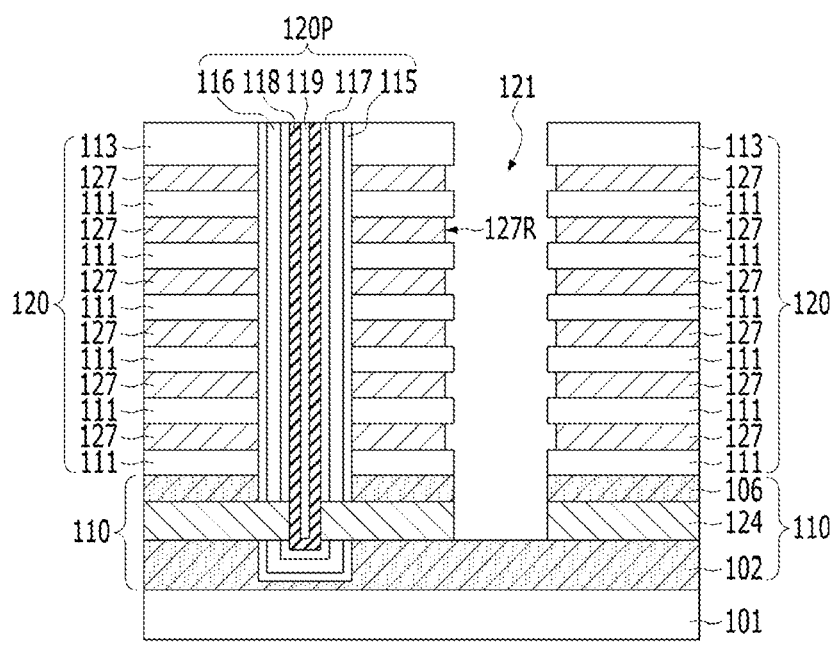

Referring to FIGS. 8 to 10, the sacrificial layers 112 may be replaced with the gate electrodes 127.

As shown in FIG. 8, the sacrificial layers 112 of the second multi-layer stack 120M may be selectively removed. As a result, the horizontal gate recesses 125 may be formed between the dielectric layers 111. Since the sacrificial layer 112 includes a nitride, the sacrificial layer 112 may be removed by a chemical including a phosphoric acid ($H_3PO_4$). While the sacrificial layer 112 is removed, the sacrificial sealing layer 122 may also be removed at the same time. According to another embodiment of the present disclosure, the sacrificial sealing layer 122 may be removed after the sacrificial layer 112 is removed.

While the sacrificial layer 112 is removed, the source contact layer 124 may be sufficiently protected by a barrier oxide. The barrier oxide may serve as a protective layer for protecting the source contact layer 124 from being attacked.

The horizontal gate recesses 125 may be continuous from the vertical contact recess 121. Portions of the blocking layer 115 of the memory stack structure 120P may be exposed by the horizontal gate recesses 125.

After the horizontal gate recesses 125 are formed in the second multi-layer stack 120M in FIG. 7, a first intermediate multi-layer stack 120' may be formed. The first intermediate multi-layer stack 120' may have a structure in which the dielectric layers 111 and the horizontal gate recesses 125 alternate. A horizontal gate recess 125 may also be formed between the top dielectric layer 113 and a neighboring dielectric layer 111.

Referring to FIGS. 9 and 10, the gate electrodes 127 may fill the horizontal gate recesses 125, respectively. The gate electrode 127 may be formed by forming a gate material layer 126 to fill the horizontal gate recesses 125 (see FIG. 9). After the gate material layer 126 is formed, a second intermediate multi-layer stack 120" may be formed. The second intermediate multi-layer stack 120" may have a structure in which the dielectric layers 111 and the gate material 126 alternate. The gate material 126 may cover the sidewall of the vertical contact recess 121.

Subsequently, as illustrated in FIG. 10, gate electrodes 127 may be formed by performing an etch-back process on the gate material layer 126. The gate electrodes 127 may include a low-resistance material. The gate electrodes 127 may include a metal-based material. The gate electrodes 127 may include a metal, a metal silicide, a metal nitride, or a combination thereof. For example, the metal may include nickel, cobalt, platinum, titanium, tantalum, or tungsten. The metal silicide may include nickel silicide, cobalt silicide, platinum silicide, titanium silicide, tantalum silicide, or tungsten silicide. The gate electrodes 127 may include a stack of titanium nitride and tungsten.

The ends 127R of the gate electrodes 127 may have a shape that is horizontally recessed from the ends of the dielectric layers 111. The ends 127R of the gate electrodes 127 may be exposed by the vertical contact recess 121. The gate electrodes 127 may not contact the upper source layer 106, the lower source layer 102, and the source contact layer 124.

After the gate electrodes 127 are formed, an alternating stack 120 may be formed. The alternating stack 120 may have a structure in which the dielectric layers 111 and the gate electrodes 127 are alternately stacked. The memory stack structure 120P may penetrate through the alternating stack 120, and the vertical contact recess 121 may penetrate through the alternating stack 120.

Figure 11:
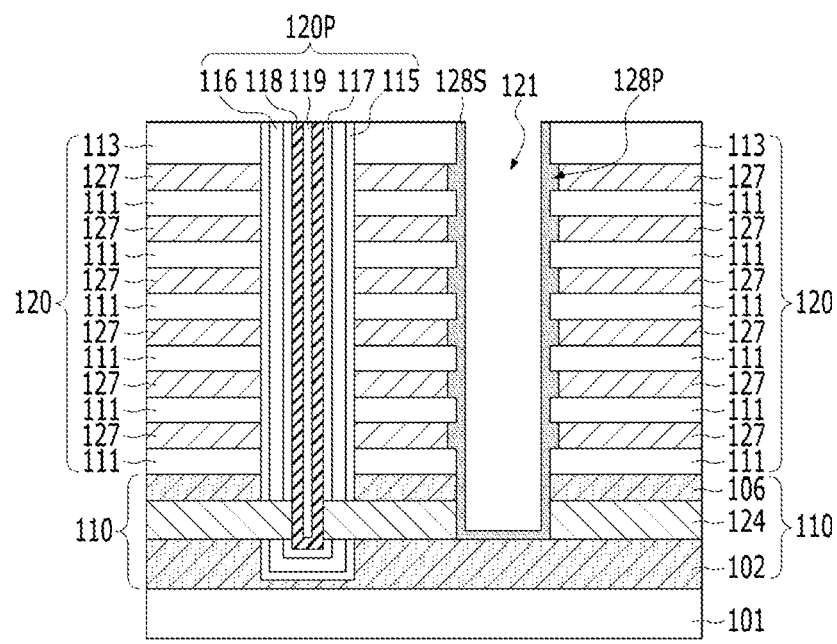

Referring to FIG. 11, the surface of the vertical contact recess 121 may be sealed. The surface of the vertical contact recess 121 may be sealed by the sealing layer 128S. The sealing layer 128S may include one or more protrusions 128P, and the protrusions 128P may seal the ends 127R of the gate electrodes 127. The sealing layer 128S may seal the side surfaces of the dielectric layers 111 and 113. The sealing layer 128S may seal the side surface of the source contact layer 124. The sealing layer 128S may seal the side surface of the upper source layer 106 and may seal the exposed surface of the lower source layer 102. The sealing layer 128S may include a silicon oxide-based material. The sealing layer 128S may include a low-dielectric material. The low-dielectric material may have a lower dielectric constant than silicon nitride. The material of the sealing layer 128S may have a dielectric constant lower than approximately 7.

The sealing layer 128S may be thinner than the dielectric layers 111 and 113 and the gate electrode 127. The sealing layer 128S may be a layer of a material that is different from that of the dielectric layers 111 and 113. The sealing layer 128S may be a layer of a material that is different from that of the gate electrode 127. The sealing layer 128S may include a material having high wet-etch resistance. The wet-etch resistance of the sealing layer 128S may be obtained by carbon. The sealing layer 128S may be formed of a carbon-containing material, and the dielectric layers 111 and 113 may be formed of a carbon-free material. The dielectric layers 111 and 113 may be formed of carbon-free silicon oxide, and the sealing layer 128S may be formed of carbon-containing silicon oxide. For example, the dielectric layers 111 and 113 may be formed of $SiO_2$, and the sealing layer 128S may be formed of SiCO. SiCO may be more etch-resistant than $SiO_2$. The carbon content in SiCO may be less than the silicon content and the oxygen content. For example, SiCO may have a composition ratio of silicon (Si) 34 at %, oxygen 40 at %, and carbon 17 at %. SiCO may have a lower dielectric constant than silicon nitride ($Si_3N_4$).

The sealing layer 128S may be formed to a thickness of approximately 50 Å to 100 Å. The high wet-etch resistance of SiCO may reduce the thickness of the sealing layer 128S. As a result, the size of the vertical contact recess 121 for separating cell blocks may be reduced, which may reduce the chip size. In a comparative example, when a sealing layer is formed of $SiO_2$, the sealing layer should be formed to have a thickness of approximately 150 Å or more in consideration of loss in the subsequent processes (e.g., a cleaning process), and the thick $SiO_2$ may inhibit a vertical contact recess from being filled with a source contact plug without voids. In order to improve the gapfill characteristics of the source contact plug, the vertical contact recess in the comparative example should be formed to have a relatively large size. In contrast, since SiCO of the sealing layer 128S in the embodiment of the present disclosure has greater wet-etch resistance than $SiO_2$, the sealing layer 128S of SiCO may be formed thinner than the sealing layer of $SiO_2$ in the comparative example. Therefore, even though the size of the vertical contact recess 121 is small, a source contact plug may fill the vertical contact recess 121 without voids.

According to another embodiment of the present disclosure, the sealing layer 128S may include a material that is wet-etch resistant to the subsequent processes. The sealing layer 128S may include SiCN, SiBCN, SiBN, or a combination thereof. The wet-etch resistance of the sealing layer 128S may be obtained from carbon, nitrogen, boron, or a combination thereof.

According to another embodiment of the present disclosure, a seed layer may be formed prior to the formation of the sealing layer 128S. The seed layer may form a thin silicon oxide or silicon nitride. By forming the seed layer, the conformality of the sealing layer 128S may be improved.

According to another embodiment of the present disclosure, the sealing layer 128S may include a stack of one or more carbon-free silicon oxide layers and one or more carbon-containing silicon oxide layers. For example, after a carbon-free silicon oxide layer is thinly deposited, a carbon-containing silicon oxide layer may be deposited over the carbon-free silicon oxide layer. The carbon-free silicon oxide may improve the conformality of the carbon-containing silicon oxide as the seed layer.

Although not illustrated, the sealing layer 128S may seal the upper surface of the top dielectric layer 113.

Figure 12:
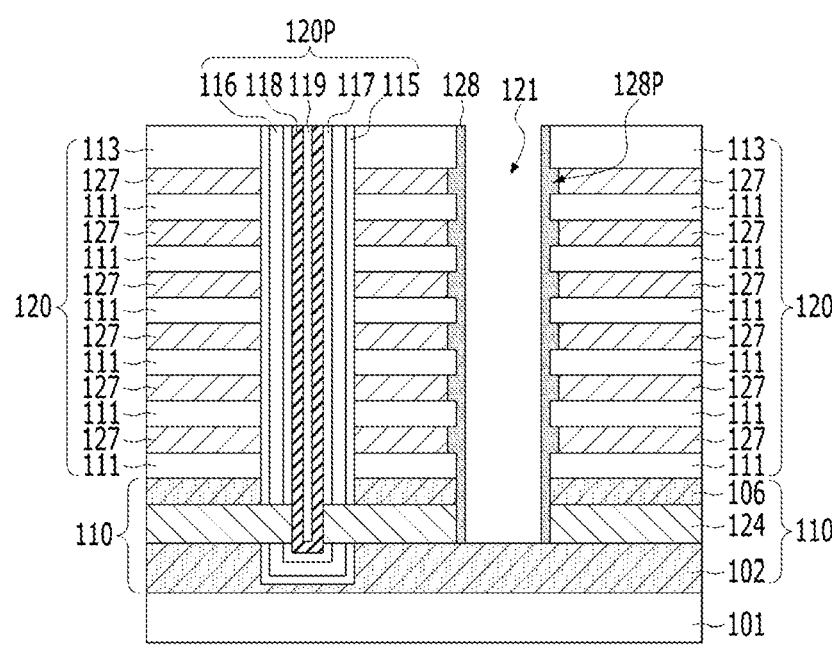

Referring to FIG. 12, the sealing layer 128S may be selectively removed to expose the surface of the lower source layer 102. As a result, a sealing spacer 128 may be formed on the sidewall of the vertical contact recess 121. The bottom portion of the sealing spacer 128 may substantially completely cover the side of the source contact layer 124 and the side of the upper source layer 106. The sealing spacer 128 may include one or more protrusions 128P, and the protrusions 128P may seal the ends 127R of the gate electrodes 127. The sealing spacer 128 may seal the sides of the dielectric layers 111 and 113.

The sealing spacer 128 may be vertically continuous along the stacking direction of the dielectric layers 111 and 113 and the gate electrodes 127. From the perspective of a top view, the sealing spacer 128 may be a closed loop-shape sealing the sidewall of the vertical contact recess 121.

Since the thickness of the sealing layer 128S is thin, the open area of the bottom surface of the vertical contact recess 121 may be increased in an etch process for forming the sealing spacer 128. As a result, it is possible to secure an electrically low resistance and process stability.

After the sealing spacer 128 is formed, a post-cleaning process may be performed.

Figure 13:
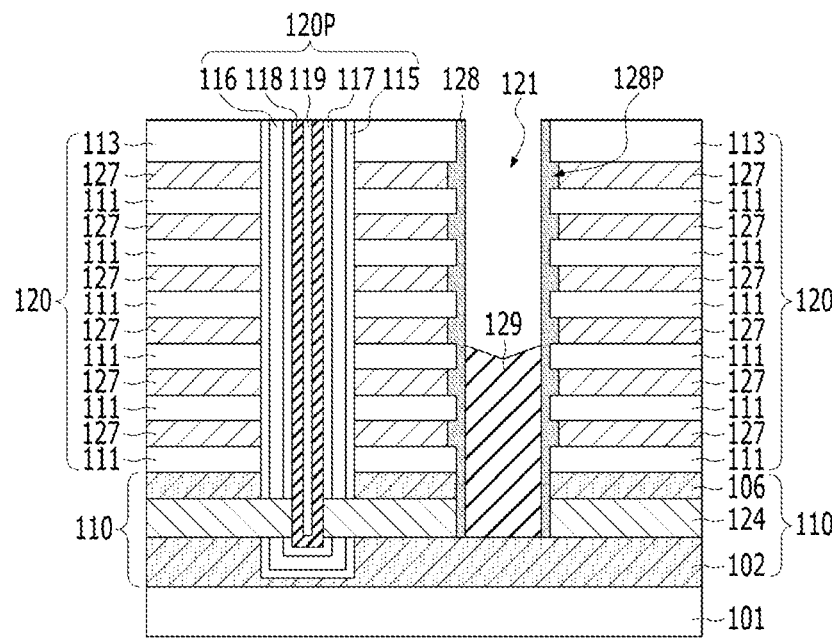
Figure 14:
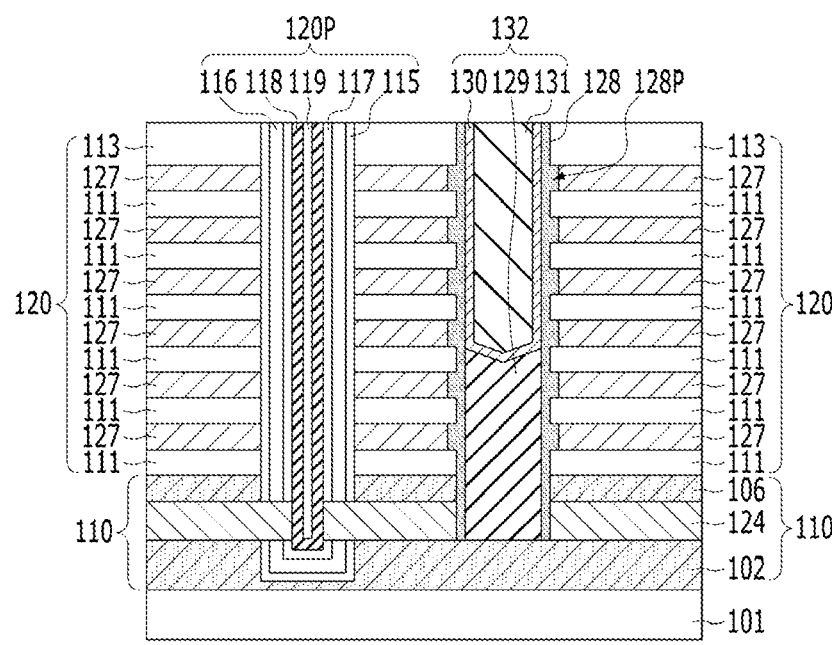

Referring to FIGS. 13 and 14, the vertical contact recess 121 may be filled with a contact material. For example, a source contact plug 132 may be formed in the vertical contact recess 121. The source contact plug 132 may fill the vertical contact recess 121. The source contact plug 132 may include a stack of a silicon-containing material 129 and a metal-containing material 131, and may further include a barrier material 130 between the silicon-containing material 129 and the metal-containing material 131. The silicon-containing material 129 may include polysilicon, and the metal-containing material 131 may include tungsten. The barrier material 130 may include titanium nitride. According to another embodiment of the present disclosure, the source contact plug 132 may be formed of tungsten alone.

The silicon-containing material 129 may be formed by depositing polysilicon to fill the vertical contact recess 121 and performing an etch-back process onto the polysilicon. A pre-cleaning process may be performed before the deposition of polysilicon, and a post-cleaning process may be performed after the etch-back process of the polysilicon. The silicon-containing material 129 may be in contact with the sealing spacer 128.

After the silicon-containing material 129 is formed, the barrier material 130 may be conformally deposited. A pre-cleaning process may be performed before the deposition of the barrier material 130. After the barrier material 130 is conformally deposited, the remainder of the vertical contact recess 121 may be filled with the metal-containing material 131. After the barrier material 130 and the metal-containing material 131 are sequentially deposited, a planarization process using Chemical Mechanical Polishing (CMP) may be performed. As a result, the barrier material 130 and the metal-containing material 131 may remain only in the vertical contact recess 121. The barrier material 130 may be in direct contact with the sealing spacer 128, and the metal-containing material 131 may not contact the sealing spacer 128.

Although a plurality of cleaning processes are performed during the process of forming the sealing spacer 128, the process of forming the silicon-containing material 129, and the process of depositing the barrier material 130, the thickness loss of the sealing spacer 128 may hardly occur.

As described above, the source-level stack 110 and the alternating stack 120 may be formed over the lower structure 101. The source-level stack 110 may include the lower source layer 102, the source contact layer 124, and the upper source layer 106. The alternating stack 120 may be formed by alternately stacking the dielectric layers 111 and the gate electrodes 127. The memory stack structure 120P may penetrate through the alternating stack 120 and the source-level stack 110. The lower outer wall of the channel layer 118 of the memory stack structure 120P may directly contact the source contact layer 124. The channel layer 118, the lower source layer 102, the upper source layer 106, and the source contact plug 132 may be electrically connected through the source contact layer 124.

The gate electrodes 127 and the source contact plug 132 may be electrically disconnected from each other by the sealing spacer 128. The gate electrodes 127 and the source contact plug 132 may be physically disconnected by the sealing spacer 128. A high voltage may be repeatedly applied between the gate electrode 127 and the source contact plug 132, thereby increasing Grown Bad Blocks (GBB). The GBB is a phenomenon that as the number of operations is increased, the number of bad blocks may be increased. According to the embodiment of the present disclosure, the sealing spacer 128 may include the carbon-containing material, thereby preventing GBB defects. In other words, since the sealing spacer 128 is formed of a material having a high wet-etch resistance, the thickness loss of the sealing spacer 128 may not substantially occur during the subsequent cleaning processes, and thus the sealing spacer 128 may be secured with a thickness that is thick enough to withstand the high voltage applied between the gate electrode 127 and the source contact plug 132.

Also, since the sealing spacer 128 is formed of a low dielectric material according to the embodiment of the present disclosure, the parasitic capacitance between the gate electrodes 127 and the source contact plug 132 may be relatively small.

Referring to FIGS. 2 to 14, a method for fabricating a vertical semiconductor device may include: forming the first multi-layer stack 110S that includes the sacrificial source layer 104 over the lower structure 101; forming the second multi-layer stack 120M in which the dielectric layers 111 and the sacrificial layers 112 are alternately stacked over the first multi-layer stack 110S; forming the memory stack structure 120P that includes the channel layer 118 extending through the second multi-layer stack 120M and the first multi-layer stack 110S; forming the vertical contact recess 121 to be spaced apart from the memory stack structure 120P and to extend through the second multi-layer stack 120M and the first multi-layer stack 110S; forming the horizontal contact recess 123 by selectively removing the sacrificial source layer 104 through the vertical contact recess 121; expanding the horizontal contact recess 123 to expose the lower outer wall of the channel layer 118; filling the expanded horizontal contact recess 123 with the source contact layer 124; replacing the sacrificial layers 112 with the gate electrodes 127; forming the sealing spacer 128 that seals the sidewall of the vertical contact recess 121 over the source contact layer 124 and the gate electrodes 127; and forming the source contact plug 132 in the vertical contact recess 121. The sealing spacer 128 may be formed of carbon-containing silicon oxide.

Figure 15:
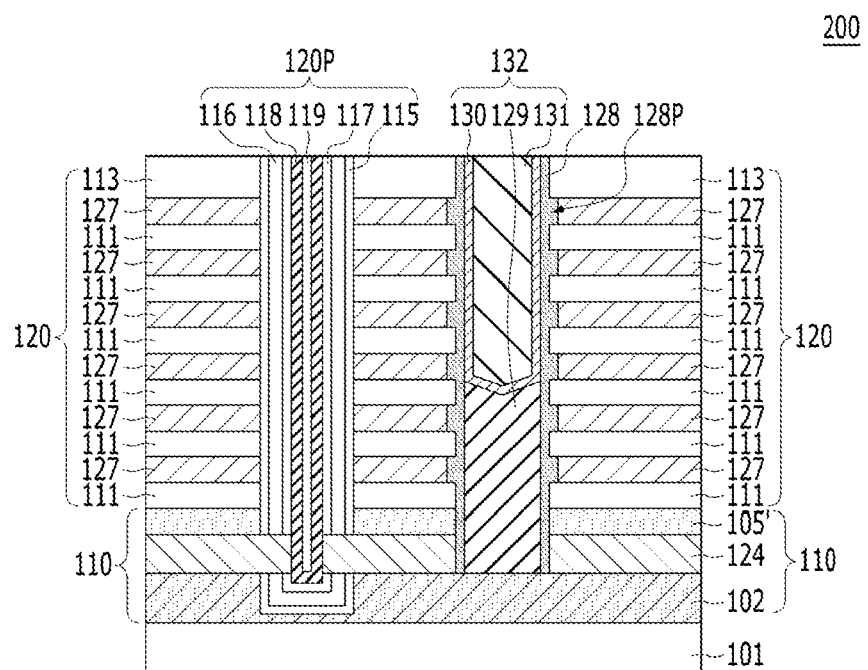
FIG. 15 is a cross-sectional view illustrating a vertical semiconductor device in accordance with another embodiment of the present disclosure.

FIG. 15 is a cross-sectional view illustrating a vertical semiconductor device 200 in accordance with another embodiment of the present disclosure.

Referring to FIG. 15, the vertical semiconductor device 200 may be positioned over the lower structure 101, and the vertical semiconductor device 200 may include an alternating stack 120 in which gate electrodes 127 and dielectric layers 111 are alternately stacked, a memory stack structure 120P including a channel layer 118 extending to penetrate through the alternating stack 120 and a stack of layers (or a memory layer) 115, 116, and 117 surrounding the channel layer 118, a source contact layer 124 disposed between the lower structure 101 and the alternating stack 120 to contact the lower outer wall of the channel layer 118, and a source contact plug 132 extending through the alternating stack 120 to be spaced apart from the memory stack structure 120P, and a sealing spacer 128 having an etch resistance that is different from the etch resistance of the dielectric layers 111 while sealing the outer wall of the source contact plug. The sealing spacer 128 may seal the gate electrodes 127 and be disposed between the source contact plug 132 and the gate electrodes 127, and may have an etch resistance that is different from that of the dielectric layers 111. The outer wall of the source contact plug 132 may be surrounded by the sealing spacer 128, which may vertically extend to cover the gate electrodes 127, the dielectric layers 111, a carbon-containing liner layer 105', and the source contact layer 124.

The lower structure 101 may include a material suitable for semiconductor processing. The lower structure 101 may include a substrate, and the substrate may include a semiconductor substrate. For example, the lower structure 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multilayer thereof. The lower structure 101 may include other semiconductor materials, such as germanium. The lower structure 101 may include a III/V-group semiconductor substrate, such as a compound semiconductor substrate, e.g., GaAs. The lower structure 101 may include a silicon on insulator (SOI) substrate. Although not shown, according to another embodiment of the present disclosure, the lower structure 101 may include a substrate, at least one or more control circuits formed over the substrate, and a multi-layer metal line.

A multi-layer stack structure may be disposed over the lower structure 101 and include a source-level stack 110 and an alternating stack 120 over the source-level stack 110. The source-level stack 110 may have a lower height than the alternating stack 120.

The source-level stack 110 may include a lower source layer 102, a source contact layer 124, and a carbon-containing liner layer 105'. The source contact layer 124 may be formed over the lower source layer 102, and the carbon-containing liner layer 105' may be formed over the source contact layer 124. The source contact layer 124 may be disposed between the lower source layer 102 and the carbon-containing liner layer 105'. The lower source layer 102 and the source contact layer 124 may include a semiconductor material. The lower source layer 102 and the source contact layer 124 may include polysilicon. The source contact layer 124 may include polysilicon doped with phosphorus (P). The source contact layer 124 may include carbon-containing polysilicon. The source contact layer 124 may include a stack of phosphorus-doped polysilicon (SiP) and carbon-doped polysilicon (SiC). The lower source layer 102 may include undoped polysilicon or doped polysilicon.

The carbon-containing liner layer 105' may include a silicon oxide-based material. The carbon-containing liner layer 105' may include at least SiCO.

The carbon-containing liner layer 105' may be a layer of a material that is different from those of the dielectric layers 111 and 113. The carbon-containing liner layer 105' may include a material having a high wet-etch resistance. The wet-etch resistance of the carbon containing liner layer 105' may be obtained from carbon. The carbon-containing liner layer 105' may be a carbon-containing material, and the dielectric layers 111 and 113 may be a carbon-free material. The dielectric layers 111 and 113 may be carbon-free silicon oxide, and the carbon-containing liner layer 105' may be carbon-containing silicon oxide. For example, the dielectric layers 111 and 113 may be $SiO_2$ and the carbon-containing liner layer 105' may be SiCO. SiCO may be more etch-resistant than $SiO_2$. The carbon content in SiCO may be smaller than the silicon content and the oxygen content. For example, SiCO may have a composition ratio of silicon (Si) 34 at %, oxygen 40 at %, and carbon 17 at %.

The carbon-containing liner layer 105' may be formed to a thickness of approximately 50 Å to 100 Å. For example, the carbon-containing liner layer 105' may have a thickness in a range from 50 Å to 100 Å in the vertical direction with respect to the orientation of FIG. 15. The high wet-etch resistance of SiCO may reduce the thickness of the carbon-containing liner layer 105'. As a result, the height of the source-level stack 110 may be reduced. The bottom dielectric layer 111 among the dielectric layers 111 may have a thickness that is thinner than each of the dielectric layers 111 at a higher level than the bottom dielectric layer 111. For example, when the carbon-containing liner layer 105' is formed of SiCO, the thickness of the bottom dielectric layer 111 may be relatively thin (e.g., approximately 200 Å). As a result, a dopant diffusion movement distance from the source contact layer 124 to the channel layer 118 adjacent to the bottom gate electrode 127 may be shortened. The dielectric layers 111 at a higher level than the bottom dielectric layer 111 may be approximately 300 Å thick.

According to another embodiment of the present disclosure, the carbon-containing liner layer 105' may be replaced with a material containing nitrogen, boron, or a combination thereof in addition to carbon.

The alternating stack 120 may be called a memory cell stack or a memory cell string. The alternating stack 120 may have a structure in which a plurality of dielectric layers 111 and a plurality of gate electrodes 127 are alternately stacked. The uppermost dielectric layer 113 among the dielectric layers 111 may be thicker than the other dielectric layers 111. The dielectric layers 111 may include silicon oxide. The gate electrodes 127 may include a low-resistance material. The gate electrodes 127 may include a metal-based material. The gate electrodes 127 may include a metal, a metal silicide, a metal nitride, or a combination thereof. For example, the metal may include nickel, cobalt, platinum, titanium, tantalum, or tungsten. The metal silicide may include nickel silicide, cobalt silicide, platinum silicide, titanium silicide, tantalum silicide or tungsten silicide. The gate electrodes 127 may include a stack of titanium nitride and tungsten. The ends (e.g., ends 127R in FIG. 24) of the gate electrodes 127 may have a shape that is horizontally recessed from the ends of the dielectric layers 111.

The memory stack structure 120P may extend vertically to penetrate through the alternating stack 120. The memory stack structure 120P may have a pillar shape. The memory stack structure 120P may include a blocking layer 115, a charge trapping layer 116, a tunnel dielectric layer 117, a channel layer 118, and a core dielectric layer 119. The memory stack structure 120P may include an ONOP structure. The ONOP structure may include a stack of an oxide layer, a nitride layer, an oxide layer, and a polysilicon layer. The blocking layer 115 and the tunnel dielectric layer 117 may include an oxide, and the charge trapping layer 116 may include a nitride, and the channel layer 118 may include polysilicon. According to an embodiment of the present disclosure, the blocking layer 115 may include a high dielectric material, and the high dielectric material may include aluminum oxide or hafnium oxide. The channel layer 118 may be a cylindrical shape having an inner space. The tunnel dielectric layer 117 may be formed on the outer wall of the channel layer 118, and the charge trapping layer 116 may be formed on the outer wall of the tunnel dielectric layer 117. The blocking layer 115 may be formed on the outer wall of the charge trapping layer 116. The inner space of the channel layer 118 may be substantially completely filled with the core dielectric layer 119. The core dielectric layer 119 may include silicon oxide or silicon nitride. The stack of the blocking layer 115, the charge trapping layer 116, and the tunnel dielectric layer 117 may be called a memory layer 115/116/117.

The source contact plug 132 may include a stack of a silicon-containing material 129 and a metal-containing material 131, and it may further include a barrier material 130 between the silicon-containing material 129 and the metal-containing material 131. The silicon-containing material 129 may include polysilicon, and the metal-containing material 131 may include tungsten. The barrier material 130 may include titanium nitride. According to another embodiment of the present disclosure, the source contact plug 132 may be formed of tungsten alone. The lower portion of the source contact plug 132 may be coupled to the lower source layer 102 of the source-level stack 110.

The sealing spacer 128 may be formed between the source contact plug 132 and the gate electrodes 127. The sealing spacer 128 may extend to be formed between the dielectric layers 111 and 113 and the source contact plug 132. The sealing spacer 128 may be continuous along the stacking direction of the alternating stack 120. The sealing spacer 128 may include one or more protrusions 128P, and the protrusions 128P may be coupled to the ends of the gate electrodes 127, respectively. The protrusions 128P of the sealing spacer 128 may seal the ends of the gate electrodes 127. The sealing spacer 128 may seal the sides of the dielectric layers 111 and 113. The sealing spacer 128 may seal the side of the source contact layer 124. The sealing spacer 128 may seal the side of the carbon-containing liner layer 105' and may not seal a portion of the surface of the lower source layer 102. The sealing spacer 128 may substantially fully surround the outer wall of the source contact plug 132.

The sealing spacer 128 may include a silicon oxide-based material. The sealing spacer 128 may include a low dielectric material. The low dielectric material may have a lower dielectric constant than silicon nitride. The sealing spacer 128 may have a dielectric constant lower than approximately 7. The sealing spacer 128 may be thinner than the dielectric layers 111 and 113 and the gate electrodes 127. The sealing spacer 128 may be a layer of a material that is different from those of the dielectric layers 111 and 113. The sealing spacer 128 may be a layer of a material that is different from that of the gate electrodes 127. The carbon-containing liner layer 105' and the sealing spacer 128 may include the same material. The sealing spacer 128 may include a material having a high wet-etch resistance. The wet-etch resistance of the sealing spacer 128 may be obtained from carbon. The sealing spacer 128 may include a carbon-containing material, and the dielectric layers 111 and 113 may include a carbon-free material. The dielectric layers 111 and 113 may be formed of carbon-free silicon oxide, and the sealing spacer 128 may be formed of carbon-containing silicon oxide. For example, the dielectric layers 111 and 113 may be formed of $SiO_2$, and the sealing spacer 128 may be formed of SiCO. SiCO may be more etch-resistant than $SiO_2$. The carbon content of SiCO may be less than the silicon content and the oxygen content of SiCO. For example, SiCO may have a composition ratio of silicon (Si) 34 at %, oxygen 40 at %, and carbon 17 at %. SiCO may have a lower dielectric constant than silicon nitride ($Si_3N_4$).

The sealing spacer 128 may be formed to have a thickness of approximately 50 Å to 100 Å. The high wet-etch resistance of SiCO may reduce the thickness of the sealing spacer 128. As a result, the size of the source contact plug 132 for separating cell blocks may be reduced, and thus the chip size may be reduced. The sealing spacer 128 may be thinner than the carbon-containing liner layer 105'.

According to another embodiment of the present disclosure, the sealing spacer 128 may include SiCN, SiBCN, SiBN, or a combination thereof. The wet-etch resistance of the sealing spacer 128 may be obtained from carbon, nitrogen, boron, or a combination thereof.

According to another embodiment of the present disclosure, the sealing spacer 128 may include a stack of one or more carbon-free silicon oxide layers and one or more carbon-containing silicon oxide layers. For example, after thinly depositing a carbon-free silicon oxide layer, a carbon-containing silicon oxide layer may be deposited over the carbon-free silicon oxide layer.

FIGS. 16, 17, 18, 19, 20, 21, 22, 23, 24, 25, 26, 27, and 28 are cross-sectional views illustrating a method for fabricating a vertical semiconductor device in accordance with another embodiment of the present disclosure. For example, FIGS. 16 to 28 show a method for fabricating the vertical semiconductor device 200 of FIG. 5.

Figure 16:
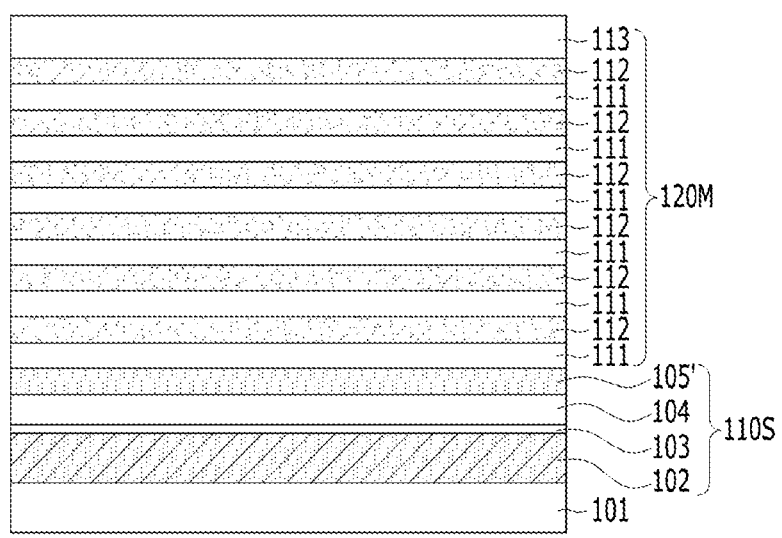
FIGS. 16 to 28 are cross-sectional views illustrating a method for fabricating a vertical semiconductor device in accordance with another embodiment of the present disclosure.

Referring to FIG. 16, a first multi-layer stack 110S may be formed over the lower structure 101. The first multi-layer stack 110S may have a stack structure including a lower source layer 102, a first liner layer 103, a source sacrificial layer 104, and a second liner layer 105'. In the first multi-layer stack 110S according to the embodiment shown in FIG. 16, a first liner layer 103 may be formed between the lower source layer 102 and the source sacrificial layer 104, and a second liner layer 105' may be formed over the source sacrificial layer 104. The lower source layer 102 and the source sacrificial layer 104 may include the same material, and the first and second liner layers 103 and 105' may include a material that is different from the materials of the lower source layer 102 and the source sacrificial layer 104. The first and second liner layers 103 and 105' may have an etch selectivity with respect to the source sacrificial layer 104. The lower source layer 102 and the source sacrificial layer 104 may include a semiconductor material, and the first and second liner layers 103 and 105' may include a dielectric material. The lower source layer 102 and the source sacrificial layer 104 may include polysilicon, and the first and second liner layers 103 and 105' may include silicon oxide. The source sacrificial layer 104 may have the same thickness or thinner thickness than the lower source layer 102 and the second liner layer 105'. The second liner layer 105' may be thicker than the first liner layer 103.

The first and second liner layers 103 and 105' may protect the lower source layer 102 while the source sacrificial layer 104 is removed.

The first and second liner layers 103 and 105' may include a silicon oxide-based material. One or both of the first liner layer 103 and the second liner layer 105' may include $SiO_2$, SiCO, or a combination thereof.

The second liner layer 105' may be a layer of a material that is different from the material of the first liner layer 103. The second liner layer 105' may include a material having high wet-etch resistance. The wet-etch resistance of the second liner layer 105' may be obtained from carbon. The second liner layer 105' may include a carbon-containing material, and the first liner layer 103 may include a carbon-free material. The first liner layer 103 may be formed of a carbon-free silicon oxide, and the second liner layer 105' may be formed of a carbon-containing silicon oxide. For example, the first liner layer 103 may be formed of $SiO_2$, and the second liner layer 105' may be formed of SiCO. SiCO may be more etch-resistant than $SiO_2$. The carbon content of SiCO may be less than the silicon content and the oxygen content of SiCO. For example, SiCO may have a composition ratio of silicon (Si) 34 at %, oxygen 40 at %, and carbon 17 at %.

The first and second liner layers 103 and 105' may be formed to have a thickness of approximately 50 Å to 100 Å. The high wet-etch resistance of SiCO may reduce the thickness of the second liner layer 105'. As a result, the height of the first multi-layer stack 110S may be reduced.

According to another embodiment of the present disclosure, the second liner layer 105' may include nitrogen, boron, or a combination thereof in addition to carbon.

As described above, the first liner layer 103 may be formed of $SiO_2$, and the second liner layer 105' may be formed of SiCO. Unlike FIG. 2, in FIG. 16, the upper source layer 106 may be omitted, and only the second liner layer 105' may be formed. The second liner layer 105' has a smaller thickness than a thickness of the upper source layer 106.

Subsequently, a second multi-layer stack 120M may be formed over the first multi-layer stack 110S. The second multi-layer stack 120M may be thicker than the first multi-layer stack 110S. The second multi-layer stack 120M may include a dielectric layer 111 and a sacrificial layer 112. The second multi-layer stack 120M may include an alternating stack of the dielectric layer 111 and the sacrificial layer 112. The dielectric layer 111 and the sacrificial layer 112 may be alternately stacked several times. The dielectric layer 111 and the sacrificial layer 112 may include different materials. The dielectric layer 111 may have an etch selectivity with respect to the sacrificial layer 112. The dielectric layer 111 may include silicon oxide, and the sacrificial layer 112 may include silicon nitride. The dielectric layer 111 and the sacrificial layer 112 may have substantially the same thickness.

The dielectric layer 111 and the sacrificial layer 112 may be formed by Chemical Vapor Deposition (CVD) or Atomic Layer Deposition (ALD). An uppermost dielectric layer (or a top dielectric layer) 113 formed at a top portion of the second multi-layer stack 120M may be attacked and damaged by the subsequent processes. Therefore, the top dielectric layer 113 may be formed thicker than that of the dielectric layers 111 disposed under the top dielectric layer 113. The top dielectric layer 113 may be used as an etch barrier. A lowermost dielectric layer (or a bottom dielectric layer) 111 in contact with the second liner layer 105' among the dielectric layers 111 may be thinner than other dielectric layers 111 over the bottom dielectric layer 111. For example, when the second liner layer 105' is formed of SiCO, the thickness of the lowermost dielectric layer 111 may be formed thin (e.g., approximately 200 Å). The other dielectric layers 111 over the bottom dielectric layer 111 may have a thickness of approximately 300 Å.

Figure 17:
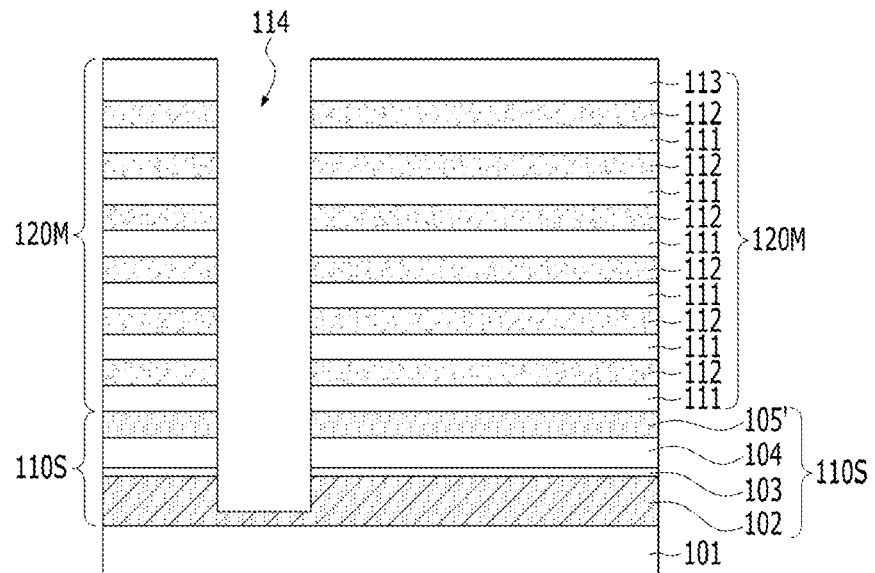

Referring to FIG. 17, a vertical opening 114 may be formed. The vertical opening 114 may be formed by etching the second multi-layer stack 120M and partially etch the first multi-layer stack 110S sequentially.

The vertical opening 114 may be formed substantially perpendicular to the surface (e.g., a top surface) of the lower structure 101. The vertical opening 114 may be shaped to penetrate though the second multi-layer stack 120M, or it may be shaped to partially penetrate though the first multi-layer stack 110S. Although not shown, from the perspective of a plan view, the vertical openings 114 may be formed in plural, and may have a hole array structure. When the vertical opening 114 is formed, the surface of the lower structure 101 may not be exposed. For example, a portion of the lower source layer 102 may remain below the bottom of the vertical opening 114. The vertical opening 114 may be called a vertical recess, a vertical hole, or a channel hole.

Figure 18:
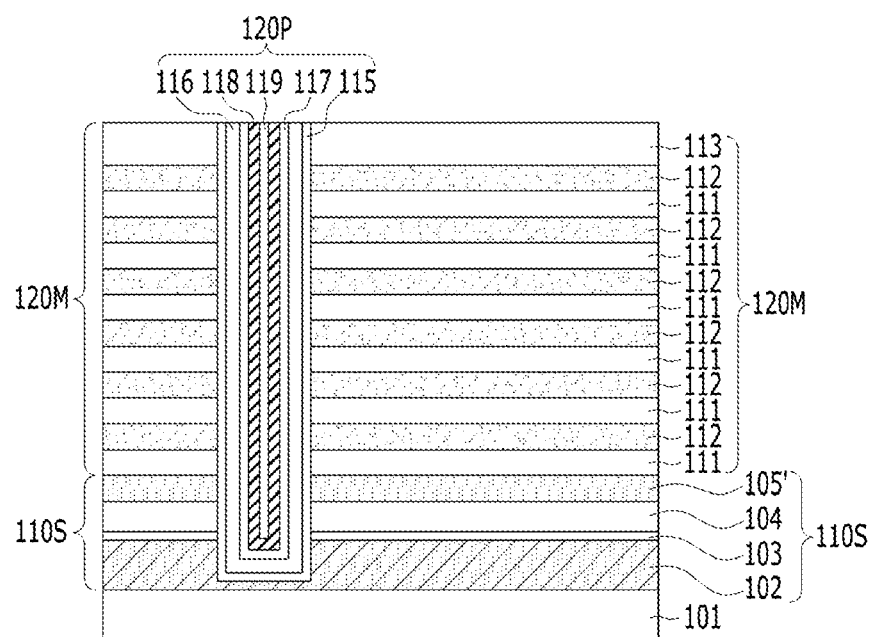

Referring to FIG. 18, a memory stack structure 120P may be formed in the vertical opening 114. The memory stack structure 120P may have a pillar shape that fills the vertical opening 114.

The memory stack structure 120P may include a blocking layer 115, a charge trapping layer 116, a tunnel dielectric layer 117, and a channel layer 118. The memory stack structure 120P may include an ONOP structure. The ONOP structure may include a stack of an oxide layer, a nitride layer, an oxide layer, and a polysilicon layer. The blocking layer 115 and the tunnel dielectric layer 117 may include an oxide, the charge trapping layer 116 may include a nitride, and the channel layer 118 may include a polysilicon layer. According to an embodiment of the present disclosure, the blocking layer 115 may include a high dielectric material, and the high dielectric material may include aluminum oxide or hafnium oxide.

The channel layer 118 may have a cylindrical shape having an inner space. A tunnel dielectric layer 117 may be formed on the outer wall of the channel layer 118, and a charge trapping layer 116 may be formed on the outer wall of the tunnel dielectric layer 117. The blocking layer 115 may be formed on the outer wall of the charge trapping layer 116.

The memory stack structure 120P may further include a core dielectric layer 119. The inner space of the channel layer 118 may be substantially completely filled with the core dielectric layer 119. The core dielectric layer 119 may include silicon oxide or silicon nitride. Although not illustrated, a conductive pad coupled to the upper end of the channel layer 118 may be further formed after the core dielectric layer 119 is recessed.

The stack of the blocking layer 115, the charge trapping layer 116, and the tunnel dielectric layer 117 may be referred to as a memory layer, and the charge trapping layer 116 may be referred to as a memory material layer.

Figure 19:
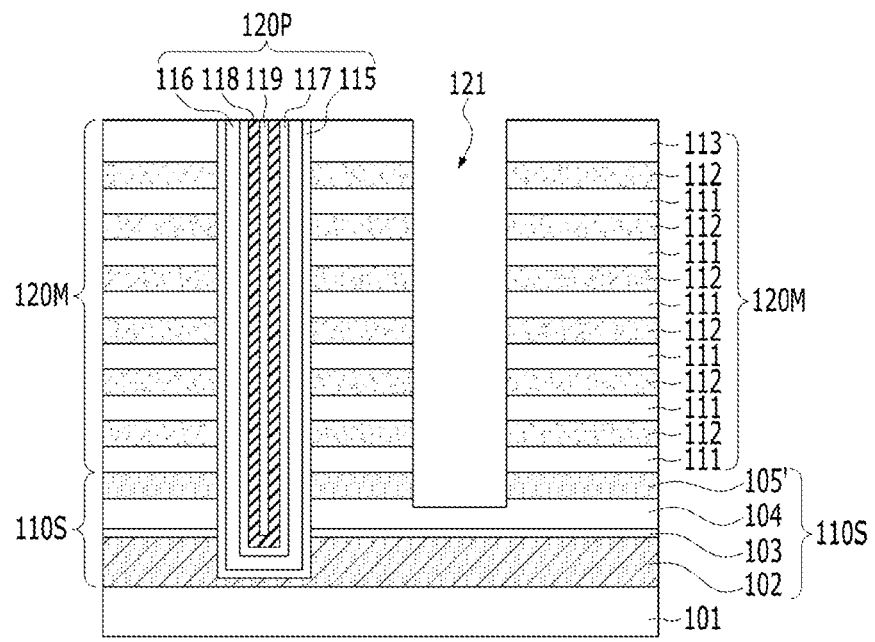

Referring to FIG. 19, a vertical contact recess 121 may be formed. The vertical contact recess 121 may be formed to be spaced apart from the memory stack structure 120P. The vertical contact recess 121 may be formed by etching the second multi-layer stack 120M, and the vertical contact recess 121 may extend downward to a portion of the first multi-layer stack 110S. The bottom portion of the vertical contact recess 121 may penetrate through the second liner layer 105'. The etch process for forming the vertical contact recess 121 may stop at the source sacrificial layer 104. According to another embodiment of the present disclosure, the top surface of the source sacrificial layer 104 may be partially recessed during the vertical contact recess 121 is formed. The vertical contact recess 121 may be referred to as a slit or trench. From the perspective of a top view, the vertical contact recess 121 may have a line shape extending in one direction. The vertical contact recess 121 may have a high aspect ratio perpendicular to the surface of the lower structure 101.

Figure 20:
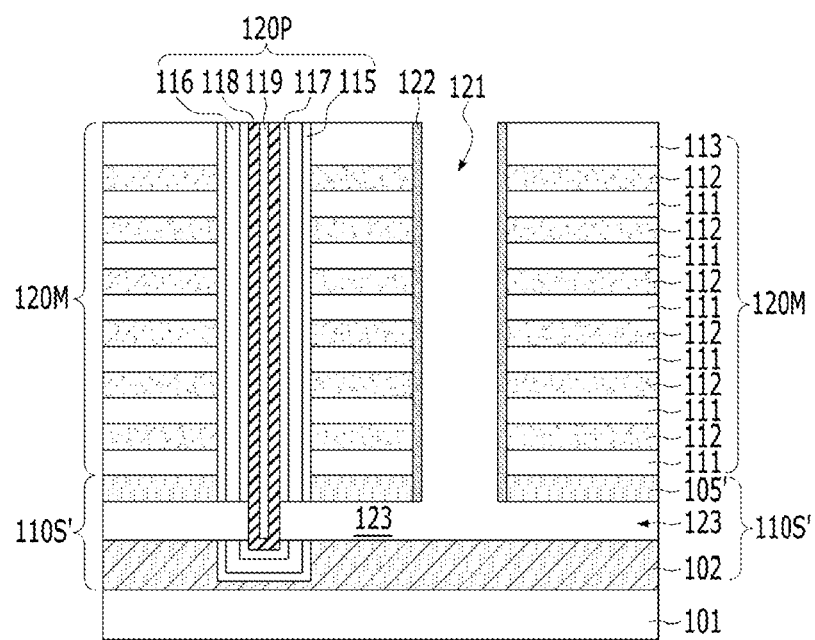

Referring to FIG. 20, a sacrificial sealing layer 122 may be formed on the sidewall of the vertical contact recess 121. The sacrificial sealing layer 122 may be formed as a spacer on the sidewall of the vertical contact recess 121. The sacrificial sealing layer 122 may be formed by conformally forming a sacrificial sealing material layer and then performing a cut process on the sacrificial sealing material layer.

The sacrificial sealing material layer for forming the sacrificial sealing layer 122 may include an oxide, a nitride, or a combination thereof. For example, the sacrificial sealing material layer, which includes a combination of an oxide and a nitride, may include a first sealing layer, a second sealing layer, and a third sealing layer. The first sealing layer and the third sealing layer may include the same material, and the second sealing layer may include a material that is different from those of the first and third sealing layers. The second sealing layer may have an etch selectivity with respect to the first and third sealing layers. The first sealing layer and the third sealing layer may include an oxide, and the second sealing layer may include a nitride. Thus, the sacrificial sealing layer 122 may include a NON structure. The NON structure may refer to a stack of a nitride, an oxide, and a nitride. The sacrificial sealing material layer may cover the bottom and sidewalls of the vertical contact recess 121.

The sacrificial sealing material layer may go through a cutting process, and as a result, the sacrificial sealing layer 122 may be formed. The cutting process of the sacrificial sealing material layer may include an etch process, and the surface (e.g., the top surface) of the source sacrificial layer 104 may be exposed as a result of the cutting process. After the cutting process, the sacrificial sealing material layer may remain as a spacer-type sacrificial sealing layer 122 on the sidewall of the vertical contact recess 121. The cutting process of the sacrificial sealing material layer may include an etch-back process.

Subsequently, the source sacrificial layer 104 may be selectively removed through the vertical contact recess 121. As a result, a horizontal contact recess 123 may be formed. The vertical contact recess 121 and the horizontal contact recess 123 may be coupled to each other. The horizontal contact recess 123 may be formed between the second liner layer 105' and the first liner layer 103 by removing the source sacrificial layer 104 by a dip-out process. The horizontal contact recess 123 may be parallel to the surface of the lower structure 101. When the source sacrificial layer 104 is removed, the first and second liner layers 103 and 105' may remain without being removed due to their etch selectivity. The horizontal contact recess 123 may be formed in the first multi-layer stack 110S. When the source sacrificial layer 104 is removed, the lower source layer 102 may not be removed. A wet-etch process may be applied to remove the source sacrificial layer 104. Since the source sacrificial layer 104 includes a polysilicon layer, the wet-etch process may include a chemical capable of etching the polysilicon layer.

A portion of the horizontal contact recess 123 may expose the lower sidewall of the memory stack structure 120P. The outer wall of the memory stack structure 120P may be a blocking layer 115, and the blocking layer 115 of the memory stack structure 120P may be exposed by the horizontal contact recess 123. Since the blocking layer 115 includes an oxide, the blocking layer 115 of the memory stack structure 120P may have an etch selectivity with respect to the source sacrificial layer 104 and thus it may not be etched while the source sacrificial layer 104 is removed. From the perspective of a top view, the horizontal contact recess 123 may be shaped to surround the outer wall of the bottom portion of the memory stack structure 120P.

Subsequently, the first liner layer 103 may be removed. As a result, the height of the horizontal contact recess 123 may increase in the vertical direction with respect to the orientation of FIG. 20. The expanded horizontal contact recess 123 may directly contact the lower source layer 102 and the second liner layer 105'.

While the first liner layer 103 is removed, the blocking layer 115 of the bottom portion of the memory stack structure 120P may be removed. Thus, the charge trapping layer 116 of the memory stack structure 120P may be exposed. A wet-etch process may be applied to remove the first liner layer 103. The wet-etch process may include a chemical that may selectively remove silicon oxide. While the first liner layer 103 is removed, the second liner layer 105' may not be removed because it has a wet-etch resistance.

Subsequently, the charge trapping layer 116 in the bottom portion of the memory stack structure 120P may be removed through the vertical contact recess 121 and the horizontal contact recess 123. The charge trapping layer 116 may be removed by a wet-etch process. When the charge trapping layer 116 includes a nitride, the wet-etch process may include a chemical capable of etching the nitride.

By removing the charge trapping layer 116, the horizontal length of the horizontal contact recess 123 may be increased.

Subsequently, the tunnel dielectric layer 117 in the bottom portion of the memory stack structure 120P may be removed through the vertical contact recess 121 and the horizontal contact recess 123. The tunnel dielectric layer 117 may be removed by a wet-etch process. When the tunnel dielectric layer 117 includes an oxide, the wet-etch process may include a chemical capable of etching the oxide.

By removing the tunnel dielectric layer 117, the horizontal length of the horizontal contact recess 123 may be increased.

While the process of removing the source sacrificial layer 104, the process of removing the first liner layer 103, the process of removing the blocking layer 115, the process of removing the charge trapping layer 116, the process of removing the tunnel dielectric layer 117 are performed as described above, the sacrificial sealing layer 122 may serve as an etch barrier for protecting the dielectric layers 111 and 113 and the sacrificial layer 112.

The outer wall of the bottom portion of the channel layer 118 of the memory stack structure 120P may be exposed by the processes of expanding the horizontal contact recess 123.

The first multi-layer stack in which one or more horizontal contact recesses 123 are formed may be denoted by 110S'. The remaining second liner layer 105' may be referred to as a carbon-containing liner layer.

A contact opening penetrating through the first multi-layer stack 110S' and the second multi-layer stack 120M may be formed through a series of the processes illustrated in FIGS. 16 to 20. The contact opening may include a vertical contact recess 121 and a horizontal contact recess 123. The horizontal contact recess 123 may extend from the vertical contact recess 121. The vertical contact recess 121 may extend in a direction (e.g., a vertical direction) perpendicular to the surface (e.g., the top surface) of the lower structure 101, and the horizontal contact recess 123 may extend in a direction (e.g., a horizontal direction) parallel to the surface of the lower structure 101. The horizontal contact recess 123 may have a high aspect ratio that is parallel to the surface of the lower structure 101. The vertical contact recess 121 may have a high aspect ratio that is perpendicular to the lower structure 101.

Subsequently, processes similar to those shown in FIGS. 7 to 14 may be performed over the resulting structure shown in FIG. 20. Hereinafter, descriptions will be given with reference to FIGS. 21 to 28.

Figure 21:
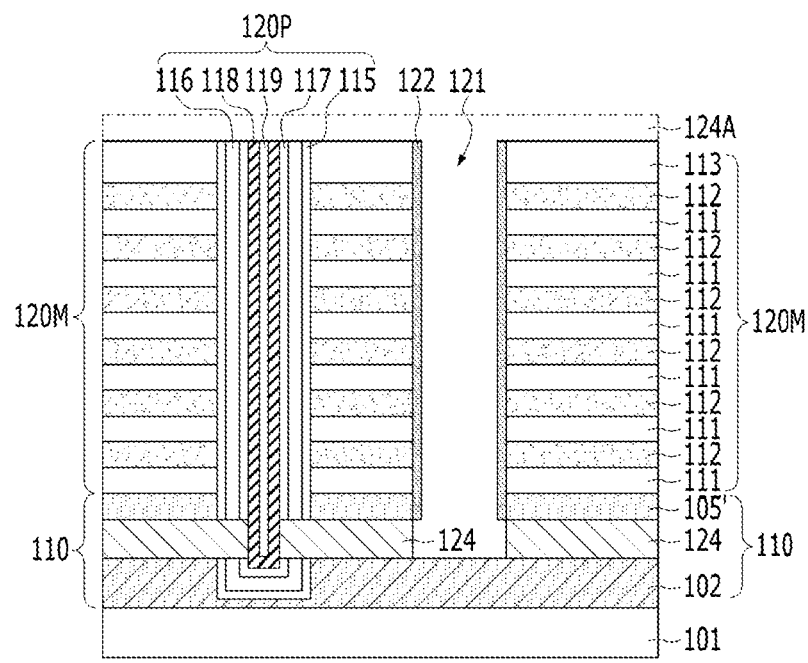

Referring to FIG. 21, a source contact material 124A may be formed to fill a contact opening, e.g., a vertical recess 121 and a horizontal contact recess 123. The source contact material 124A may include a conductive material. The source contact material 124A may include polysilicon. The source contact material 124A may include phosphorus (P)-doped polysilicon. The source contact material 124A may include carbon-containing polysilicon. The source contact material 124A may include a stack of phosphorus-doped polysilicon (SiP) and carbon-doped polysilicon (SiC).

Subsequently, the source contact material 124A may be selectively removed. The selective removal of the source contact material 124A may include a recessing process, and the recessing process may include a wet-etch process. As a result of performing the wet-etching process on the source contact material 124A, a source contact layer 124 may be formed in the horizontal contact recess 123. The source contact layer 124 may partially fill the horizontal contact recess 123. For example, the source contact material 124A may be etched such that the source contact layer 124 is self-aligned to the sidewall of the sacrificial sealing layer 122, and thus the bottom of the vertical recess 121 may directly contact the lower source layer 102. The source contact layer 124 may remain in the horizontal contact recess 123, and the source contact layer 124 may not remain in the vertical recess 121.

Although not illustrated, the source contact layer 124 may subsequently be exposed to an oxidation process. The oxidation process may include dry oxidation or wet oxidation. An edge of the source contact layer 124 may be oxidized by the oxidation process. As a result, a barrier oxide (not shown) may be formed at the edge of the source contact layer 124. The barrier oxide may include silicon oxide. The barrier oxide may protect the source contact layer 124 from being attacked during the subsequent process.

The first multi-layer stack 110S' in which the source contact layer 124 is formed may be simply referred to as a source-level stack 110. The source level stack 110 may be disposed below the second multi-layer stack 120M, and the source contact layer 124 may be directly coupled to the channel layer 118 of the memory stack structure 120P.

As described above, the source-level stack 110 which is formed by a series of processes of replacing the source sacrificial layer 104 with the source contact layer 124 may have a structure in which the source contact layer 124 is embedded.

Figure 22:
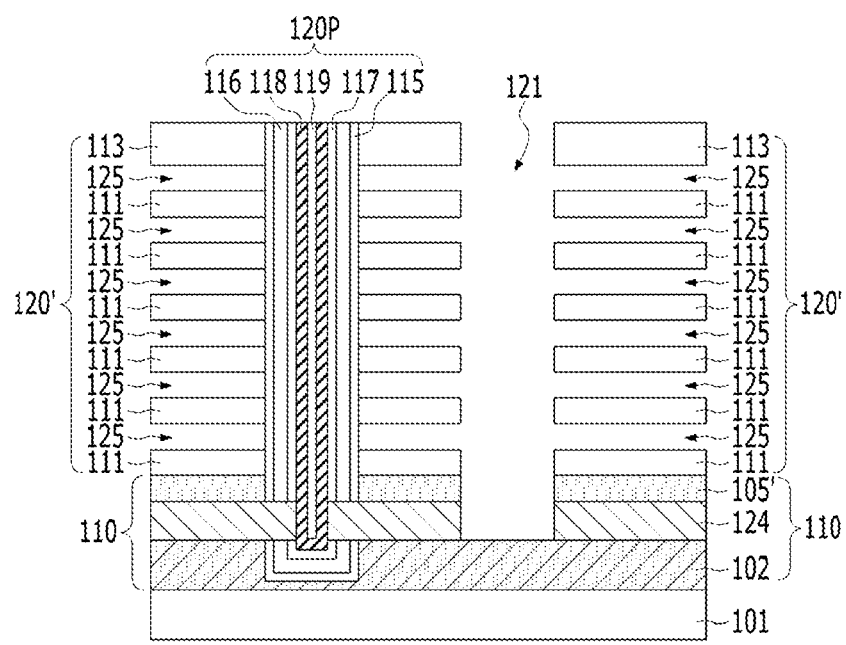

Referring to FIG. 22, the sacrificial layers 112 of the second multi-layer stack 120M may be selectively removed. As a result, horizontal gate recesses 125 may be formed between the dielectric layers 111. Since the sacrificial layer 112 includes nitride, the sacrificial layer 112 may be removed by a chemical including phosphoric acid ($H_3PO_4$). While the sacrificial layer 112 is removed, the sacrificial sealing layer 122 may also be removed at the same time. According to another embodiment of the present disclosure, the sacrificial sealing layer 122 may be removed after the sacrificial layer 112 is removed.

While the sacrificial layer 112 is removed, the source contact layer 124 may be sufficiently protected by a barrier oxide. The barrier oxide may serve as a protective layer for protecting the source contact layer 124 from being attacked.

The horizontal gate recesses 125 may be continuous from the vertical contact recess 121. Portions of the blocking layer 115 of the memory stack structure 120P may be exposed by the horizontal gate recesses 125.

After the horizontal gate recesses 125 are formed in the second multi-layer stack 120M in FIG. 21, a first intermediate multi-layer stack 120' may be formed. The first intermediate multi-layer stack 120' may have a structure in which the dielectric layers 111 and the horizontal gate recesses 125 alternate. The horizontal gate recess 125 may also be formed between the top dielectric layer 113 and the neighboring dielectric layer 111 as well.

Figure 23:
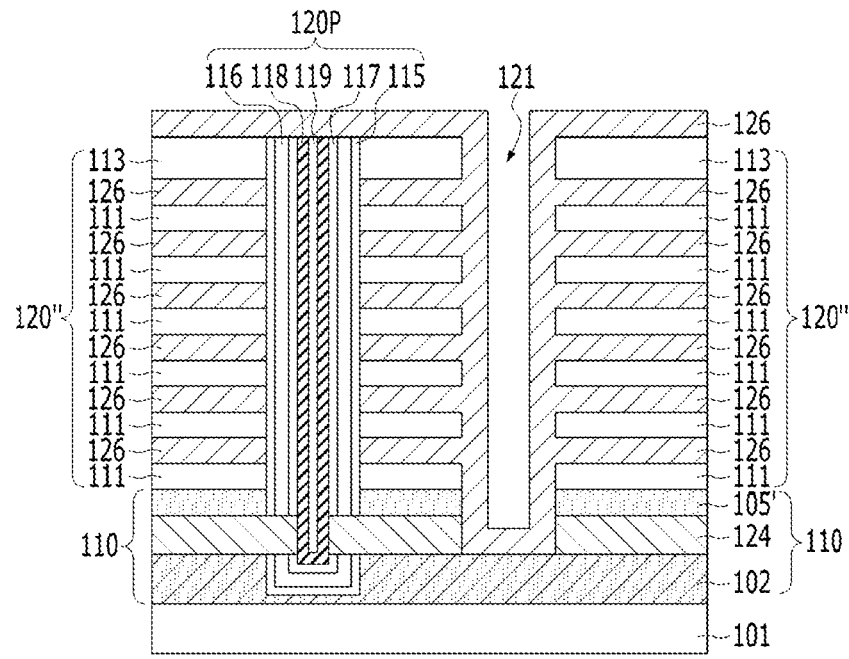
Figure 24:
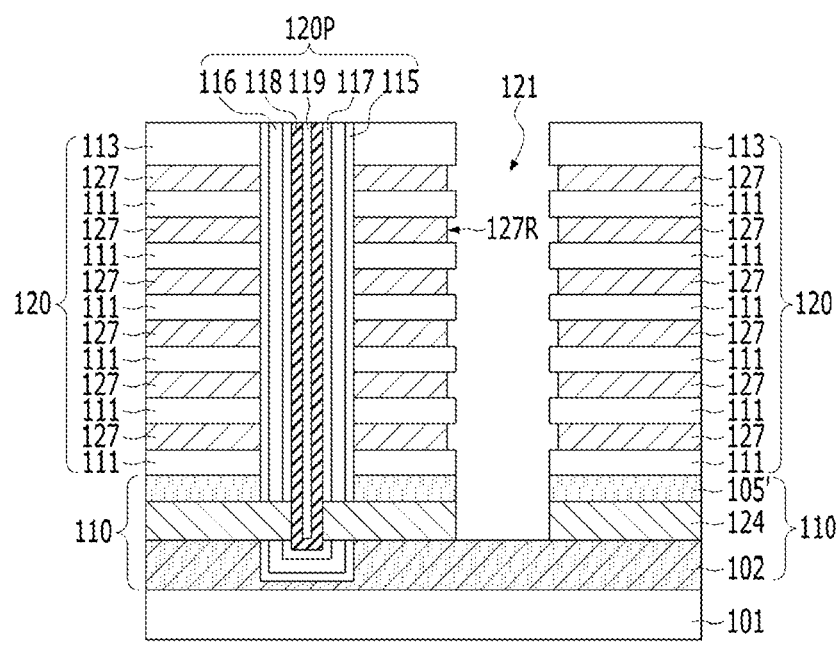

Referring to FIGS. 23 and 24, the gate electrodes 127 may fill the horizontal gate recesses 125, respectively. In order to form the gate electrodes 127, a gate material layer 126 may be deposited to fill the horizontal gate recesses 125 (see FIG. 23). After the gate material layer 126 is formed, a second intermediate multi-layer stack 120" may be formed. The second intermediate multi-layer stack 120" may have a structure in which the dielectric layers 111 and the gate material 126 alternate, and the gate material 126 may cover the sidewalls of the vertical contact recesses 121.

Subsequently, as illustrated in FIG. 24, the gate electrodes 127 may be formed by performing an etch-back process on the gate material layer 126. The gate electrodes 127 may include a low resistance material. The gate electrodes 127 may include a metal-based material. The gate electrodes 127 may include a metal, a metal silicide, a metal nitride, or a combination thereof. For example, the metal may include nickel, cobalt, platinum, titanium, tantalum, or tungsten. The metal silicide may include nickel silicide, cobalt silicide, platinum silicide, titanium silicide, tantalum silicide, or tungsten silicide. The gate electrodes 127 may include a stack of titanium nitride and tungsten.

The ends 127R of the gate electrodes 127 may have a shape that is horizontally recessed from the ends of the dielectric layers 111. The ends 127R of the gate electrodes 127 may be exposed by the vertical contact recesses 121. The gate electrodes 127 may not contact the second liner layer 105', the lower source layer 102, and the source contact layer 124.

After the gate electrodes 127 are formed, an alternating stack 120 may be formed. The alternating stack 120 may have a structure in which the dielectric layers 111 and the gate electrodes 127 are stacked alternately. The memory stack structure 120P may penetrate through the alternating stack 120, and the vertical contact recesses 121 may penetrate through the alternating stack 120.

The source-level stack 110 may include a lower source layer 102, a source contact layer 124, and a second liner layer 105', and the bottom portion of the vertical contact recess 121 may not penetrate the lower source layer 102. Hereinafter, the second liner layer 105' may be called a carbon-containing liner layer 105'.

Figure 25:
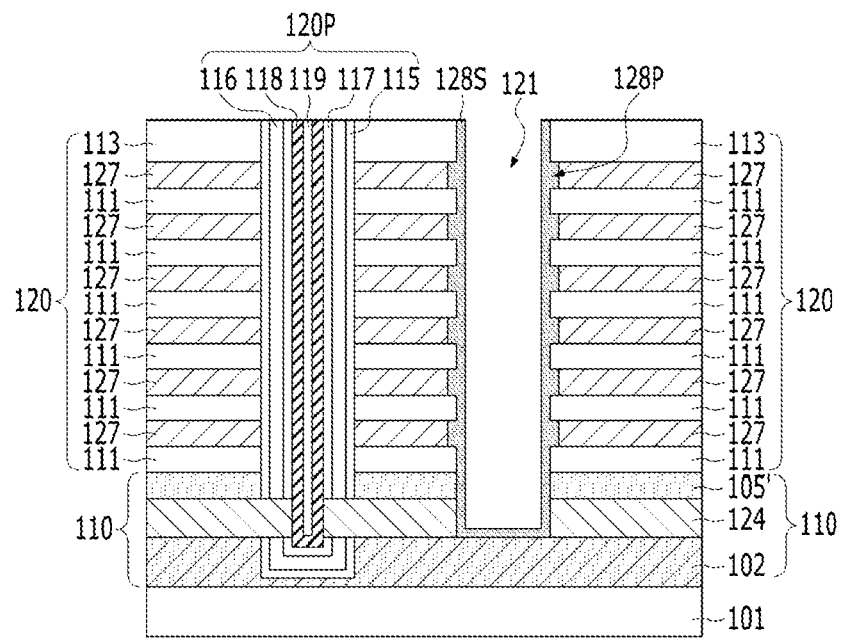

Referring to FIG. 25, the surface of the vertical contact recesses 121 may be sealed. The surface of the vertical contact recesses 121 may be sealed by a sealing layer 128S. The sealing layer 128S may include one or more protrusions 128P, and the protrusions 128P may seal the ends 127R of the gate electrodes 127. The sealing layer 128S may seal the sides of the dielectric layers 111 and 113. The sealing layer 128S may seal the side of the source contact layer 124. The sealing layer 128S may seal the side of the carbon-containing liner layer 105' and may seal the exposed surface of the lower source layer 102. The sealing layer 128S may include a silicon oxide-based material. The sealing layer 128S may include a low dielectric material. The low dielectric material may have a lower dielectric constant than silicon nitride. The material of the sealing layer 128S may have a dielectric constant that is lower than approximately 7.

The sealing layer 128S may be thinner than the dielectric layers 111 and 113 and the gate electrode 127. The sealing layer 128S may be a layer of a material that is different from the material of the dielectric layers 111 and 113. The sealing layer 128S may be a layer of a material that is different from that of the gate electrode 127. The sealing layer 128S may include a material having a high wet-etch resistance. The wet-etch resistance of the sealing layer 128S may be obtained from carbon. The sealing layer 128S may be formed of a carbon-containing material, and the dielectric layers 111 and 113 may be formed of a carbon-free material. The dielectric layers 111 and 113 may be formed of carbon-free silicon oxide, and the sealing layer 128S may be formed of carbon-containing silicon oxide. For example, the dielectric layers 111 and 113 may be formed of $SiO_2$ and the sealing layer 128S may be formed of SiCO. SiCO may be more etch-resistant than $SiO_2$. The carbon content of SiCO may be less than the silicon content and the oxygen content. For example, SiCO may have a composition ratio of silicon (Si) 34 at %, oxygen 40 at %, and carbon 17 at %. SiCO may have a lower dielectric constant than silicon nitride ($Si_3N_4$).

The sealing layer 128S may be formed to have a thickness of approximately 50 Å to 100 Å. The high wet-etch resistance of SiCO may reduce the thickness of the sealing layer 128S. As a result, the size of each of the vertical contact recesses 121 for separating cell blocks may be reduced, which eventually leads to decreased chip size. In a comparative example, when a sealing layer is formed of $SiO_2$, the sealing layer should be formed to have a thickness of approximately 150 Å or thicker in consideration of loss in the subsequent processes (e.g., a cleaning process). The thick $SiO_2$ sealing layer of the comparative example may make it difficult to fill the vertical contact recesses with source contact plugs without voids, and each of the vertical contact recesses of the comparative example should have a relatively large size in order to improve the gap-fill characteristics of the source contact plugs. On the contrary, since SiCO of the sealing layer 128S according to an embodiment of the present disclosure has a higher wet-etch resistance than $SiO_2$, the sealing layer 128S may be formed thinner than the sealing layer of $SiO_2$ in the comparative example. Therefore, even though the size of the vertical contact recesses 121 is small, the vertical contact recesses 121 may be filled with source contact plugs without voids.

According to another embodiment of the present disclosure, the sealing layer 128S may include a material that is wet-etch resistant with respect to the subsequent processes. The sealing layer 128S may include SiCN, SiBCN, SiBN, or a combination thereof. The wet-etch resistance of the sealing layer 128S may be obtained from carbon, nitrogen, boron, or a combination thereof.

According to another embodiment of the present disclosure, a seed layer may be formed prior to the formation of the sealing layer 128S. The seed layer may form a thin silicon oxide layer or a thin silicon nitride layer. By forming the seed layer, the conformality of the sealing layer 128S may be improved.

According to another embodiment of the present disclosure, the sealing layer 128S may include a stack of one or more carbon-free silicon oxide layers and one or more carbon-containing silicon oxide layers. For example, after thinly depositing a carbon-free silicon oxide layer, a carbon-containing silicon oxide layer may be deposited over the carbon-free silicon oxide layer. The carbon-free silicon oxide may improve the conformality of the carbon-containing silicon oxide as the seed layer.

Figure 26:
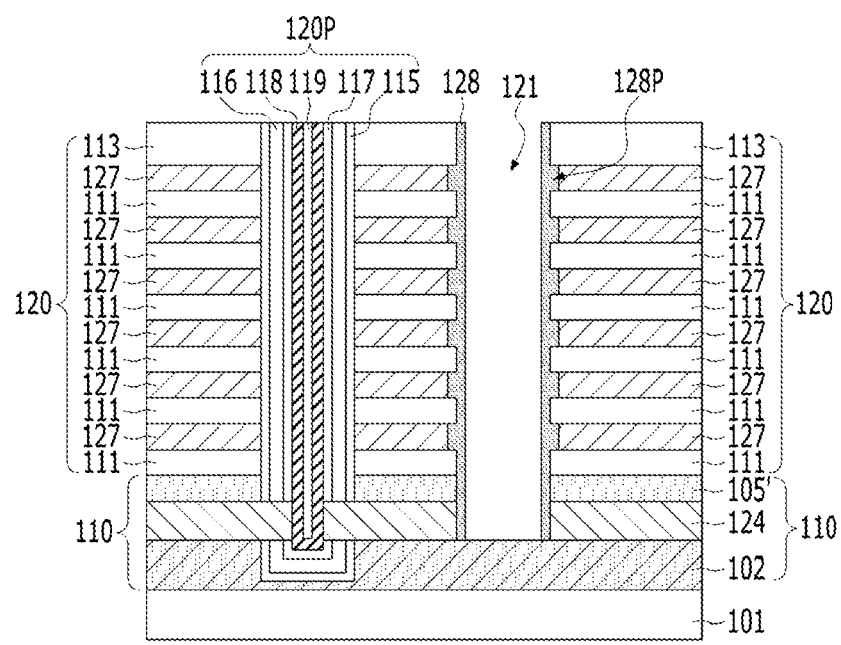

Referring to FIG. 26, the sealing layer 128S may be selectively removed to expose the surface of the lower source layer 102. As a result, a sealing spacer 128 may be formed on the sidewall of the vertical contact recess 121. The bottom portion of the sealing spacer 128 may substantially completely cover the side of the source contact layer 124 and the side of the carbon-containing liner layer 105'.

The sealing spacer 128 may include one or more protrusions 128P, and the protrusions 128P may seal the ends 127R of the gate electrodes 127. The sealing spacer 128 may seal the sides of the dielectric layers 111 and 113.

The sealing spacer 128 may be vertically continuous along the stacking direction of the dielectric layers 111 and the gate electrodes 127. From the perspective of a top view, the sealing spacer 128 may have a closed loop-shape that seals the sidewalls of the vertical contact recesses 121.

Since the thickness of the sealing layer 128S is thin, the open area of the bottom surface of the vertical contact recess 121 may be increased in an etch process for forming the sealing spacer 128. As a result, it is possible to secure an electrically low resistance and process stability.

After the sealing spacer 128 is formed, a post-cleaning process may be performed.

Figure 27:
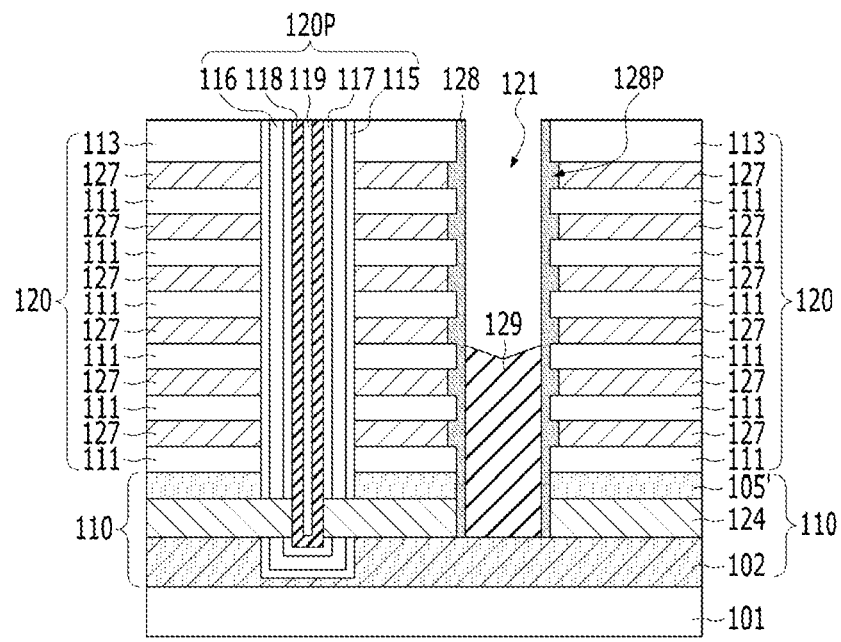
Figure 28:
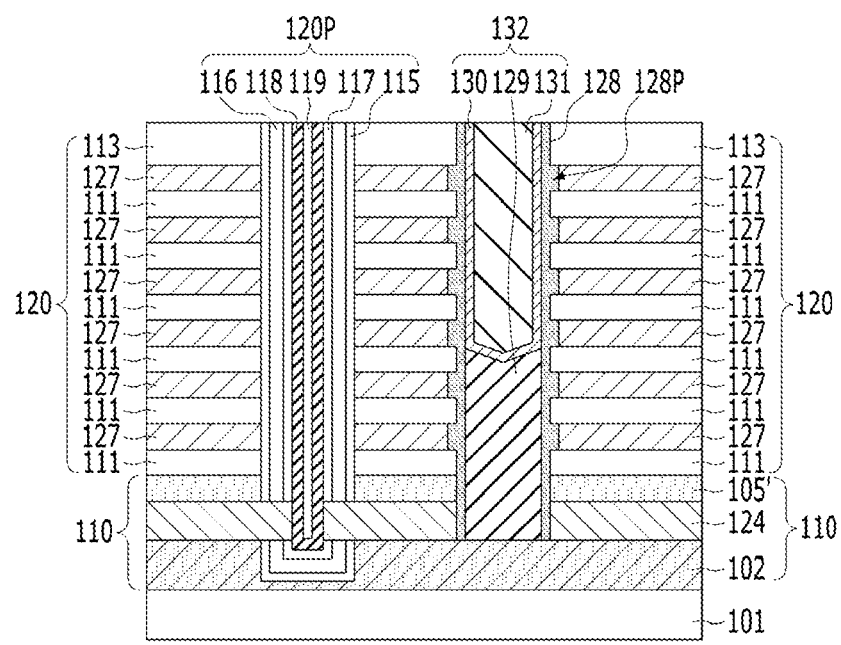

Referring to FIGS. 27 and 28, the vertical contact recesses 121 may be filled with a conductive contact material. For example, a source contact plug 132 may be formed in each vertical contact recess 121. The source contact plugs 132 may fill the vertical contact recesses 121. Each of the source contact plugs 132 may include a stack of a silicon-containing material 129 and a metal-containing material 131, and it may further include a barrier material 130 between the silicon-containing material 129 and the metal-containing material 131. The silicon-containing material 129 may include polysilicon, and the metal-containing material 131 may include tungsten. The barrier material 130 may include titanium nitride. According to another embodiment of the present disclosure, the source contact plugs 132 may be formed of tungsten alone.

The silicon-containing material 129 may be formed by depositing polysilicon to fill the vertical contact recesses 121 and then performing an etch-back process on the polysilicon. A pre-cleaning process may be performed before the deposition of the polysilicon, and a post-cleaning process may be performed after the etch-back process of the polysilicon. The silicon-containing material 129 may be in contact with the sealing spacer 128.

After the silicon-containing material 129 is formed, the barrier material 130 may be conformally deposited. A pre-cleaning process may be performed before the deposition of the barrier material 130. After the conformal deposition of the barrier material 130, the remainder of the vertical contact recess 121 may be filled with the metal-containing material 131. After the barrier material 130 and the metal-containing material 131 are sequentially deposited, a planarization process using Chemical Mechanical Polishing (CMP) may be performed. As a result, the barrier material 130 and the metal-containing material 131 may remain only inside the vertical contact recess 121. The barrier material 130 may be in direct contact with the sealing spacer 128, and the metal-containing material 131 may not contact the sealing spacer 128.

Although a plurality of cleaning processes are performed during the process of forming the sealing spacer 128, the process of forming the silicon-containing material 129, and the process of depositing the barrier material 130, thickness loss of the sealing spacer 128 may hardly occur.

As described above, the source-level stack 110 and the alternating stack 120 may be formed over the lower structure 101. The source-level stack 110 may include a lower source layer 102, a source contact layer 124, and a carbon-containing liner layer 105'. The alternating stack 120 may be formed by alternately stacking the dielectric layers 111 and the gate electrodes 127. The memory stack structure 120P may completely penetrate through the alternating stack 120 and may not completely penetrate through the source-level stack 110. The bottom portion of the memory stack structure 120P may penetrate through the carbon-containing liner layer 105' and the source contact layer 104 of the source-level stack 110, but may not penetrate through the lower source layer 102. The outer wall of the bottom portion of the channel layer 118 of the memory stack structure 120P may directly contact the source contact layer 124. The channel layer 118, the lower source layer 102, and the source contact plug 132 may be electrically connected through the source contact layer 124.

The gate electrodes 127 and the source contact plug 132 may be electrically disconnected by the sealing spacer 128. The gate electrodes 127 and the source contact plug 132 may be physically disconnected by the sealing spacer 128. A high voltage may be repeatedly applied between the gate electrode 127 and the source contact plug 132, which increases GBB. This is called a Grown Bad Block phenomenon. According to the embodiment of the present disclosure, the GBB defects may be prevented by forming the sealing spacer 128 including a carbon-containing material. In other words, since the sealing spacer 128 is formed of a material having a high wet-etch resistance, thickness loss of the sealing spacer 128 may not substantially occur during the subsequent cleaning processes. Thus, the sealing spacer 128 may be formed thick enough to withstand the high voltage applied between the gate electrode 127 and the source contact plug 132.

Also, since the sealing spacer 128 is formed of a low dielectric material, the parasitic capacitance between the gate electrodes 127 and the source contact plugs 132 may be reduced.

Also, according to an embodiment of the present disclosure, since the carbon-containing liner layer 105' is formed of SiCO, there is no significant thickness loss by a wet-etch chemical, and the thickness loss of SiCO caused during the process of forming the horizontal contact recesses 123 and the process of expanding the horizontal contact recesses 123 (i.e., a dry etch process and a wet-etch process for removing the blocking layer 115, the charge trapping layer 116, and the tunnel dielectric layer 117) is so small that the breakdown voltage (BV) characteristics with the source contact plugs 132 may be improved.

In addition, when the carbon-containing liner layer 105' is formed of SiCO, the bottom dielectric layer 111 may be formed relatively thin (e.g., approximately 200 Å). Thus, the dopant diffusion movement distance from the source contact layer 124 to the channel layer 118 adjacent to the bottom gate electrode 127 may be shortened. As shown in FIG. 2, when the stack of the second liner layer 105 and the upper source layer 106 is applied, the dopant diffusion movement distance may be approximately 450 Å (the bottom dielectric layer of approximately 300 Å+the upper source layer of approximately 150 Å). In contrast, when only the second liner layer 105' is applied, the dopant diffusion movement distance may be approximately 300 Å (the bottom dielectric layer 111 of approximately 200 Å+the second liner layer 105' of approximately 100 Å).

Referring to FIGS. 16 to 28, a method for fabricating a vertical semiconductor device may include: forming a first multi-layer stack 110S that includes a sacrificial source layer 104 and a carbon-containing liner layer 105' over a lower structure 101; forming a second multi-layer stack 120M in which dielectric layers 111 and sacrificial layers 112 are alternately stacked over the first multi-layer stack 110S; forming a memory stack structure 120P that includes a channel layer 118 extending to penetrate through the second multi-layer stack 120M and the first multi-layer stack 110S; forming a vertical contact recess 121 extending to penetrate through the second multi-layer stack 120M and the first multi-layer stack 110S by being spaced apart from the memory stack structure 120P; forming a horizontal contact recess 123 by selectively removing the sacrificial source layer 104 through the vertical contact recess 121; expanding the horizontal contact recess 123 to expose the lower outer wall of the channel layer 118; filling the extended horizontal contact recess 123 with the source contact layer 124; replacing the sacrificial layers 112 with the gate electrodes 127; forming a sealing spacer 128 that seals sidewalls of the vertical contact recess 121 over the source contact layer 124 and the gate electrodes 127; and forming a source contact plug 132 in the vertical contact recess 121. The carbon-containing liner layer 105' and the sealing spacer 128 may be formed of carbon-containing silicon oxide.

Carbon-containing silicon oxide, i.e., SiCO, may be applied to the process of forming contact plugs in DRAMs, logic devices, and the like. For example, after contact etch process for forming a contact hole in an inter-layer dielectric layer is performed, a SiCO spacer may be formed on the sidewall of the contact hole by depositing SiCO and performing an etch-back process. After the SiCO spacer is formed, the contact hole may be filled with a conductive contact plug. The SiCO spacer may be exposed to a plurality of cleaning processes such as a post-cleaning after the SiCO spacer is formed, a post-cleaning before the conductive contact plug is formed, and the like. Even though the SiCO spacer is exposed to the subsequent cleaning processes, since the SiCO spacer is a material with a high wet-etch resistance, there may be little thickness loss.

According to embodiments of the present disclosure, electrical characteristics may be improved as a sealing spacer is formed of a material having a high wet-etch resistance between the gate electrodes and the source contact plugs.

According to embodiments of the present disclosure, it is possible to form a sealing spacer to be thick enough to withstand the high voltage applied between a gate electrode and a source contact plug.

According to embodiments of the present disclosure, since a sealing spacer is formed of a low dielectric material, the parasitic capacitance between the gate electrodes and the source contact plugs may be reduced.

According to embodiments of the present disclosure, reliability of a vertical semiconductor device may be improved.

While the present disclosure has been described with respect to the specific embodiments, it will be apparent to those skilled in the art that various changes and modifications may be made without departing from the spirit and scope of the disclosure as defined in the following claims.

What is claimed is:
1. A method for fabricating a semiconductor device, comprising:
  forming a source sacrificial layer over a lower structure;
  forming a multi-layer stack in which dielectric layers and sacrificial layers are alternately stacked over the source sacrificial layer;
  forming a memory stack structure that includes a channel layer and a memory layer, the memory stack structure extending to penetrate through the multi-layer stack and the source sacrificial layer;

forming a vertical contact recess that is spaced apart from the memory stack structure and extends to penetrate through the multi-layer stack and the source sacrificial layer;
exposing a lower outer wall of the channel layer by selectively removing the source sacrificial layer and a lower portion of the memory layer of the memory stack structure through the vertical contact recess;
forming a source contact layer that surrounds the lower outer wall of the channel layer;
replacing the sacrificial layers of the multi-layer stack with gate electrodes to form an alternating stack;
forming a sealing spacer to seal a sidewall of the vertical contact recess over the source contact layer and the gate electrodes; and
forming a source contact plug in the vertical contact recess,
wherein the sealing spacer includes a stack of a layer of carbon-free silicon oxide and a layer of carbon-containing silicon oxide, and the carbon-containing silicon oxide is in direct contact with the source contact plug.

2. The method of claim 1, wherein the carbon-containing silicon oxide having a wet-etch resistance greater than that of the dielectric layers.

3. The method of claim 1, wherein the carbon-free silicon oxide includes $SiO_2$.

4. The method of claim 1, wherein the carbon-containing silicon oxide includes SiCO, and a carbon content of SiCO is less than a silicon content and an oxygen content.

5. The method of claim 1, wherein an outer wall of the source contact plug is surrounded by the sealing spacer, and
wherein the sealing spacer extends vertically to cover the gate electrodes, the dielectric layers, and the source contact layer, the gate electrodes and the dielectric layers being stacked vertically.

6. The method of claim 1, wherein the sealing spacer includes one or more protrusions extending in a specific direction to seal one or more ends of the gate electrodes, respectively, the specific direction being perpendicular to a direction in which the gate electrodes and the dielectric layers are stacked.

7. The method of claim 1, wherein the sealing spacer has a thickness of approximately in a range from 50 Å to 100 Å.

8. The method of claim 1, wherein the semiconductor device further comprises:
a lower source layer between the lower structure and the source contact layer; and
an upper source layer between the alternating stack and the source contact layer,
wherein each of the upper source layer and the lower source layer include a semiconductor material.

9. The method of claim 1, wherein the source contact plug includes:
a silicon-containing material pattern that fills a lower portion of the vertical contact recess;
a metal-containing material pattern disposed over the silicon-containing material, and
a barrier material layer disposed between the silicon-containing material and the metal-containing material.

10. The method of claim 1, further comprising:
a liner layer between the alternating stack and the source contact layer,
wherein the liner layer and the carbon-containing silicon oxide include the same material.

11. The method of claim 10, wherein the liner layer and the carbon-containing silicon oxide include SiCO.

12. The method of claim 10, wherein the dielectric layers of the alternating stack include a bottom dielectric layer, the remaining dielectric layers of the alternating stack disposed over the bottom dielectric layer, the bottom dielectric layer having a thickness thinner than that of each of the remaining dielectric layers.

13. The method of claim 1, further comprising forming a lower source layer over the lower structure, the source sacrificial layer disposed over the lower source layer,
wherein forming the sealing spacer comprises:
forming a sealing layer over the dielectric layers, the gate electrodes, and the source contact layer, and the lower source layer; and
removing a portion of the sealing layer to expose the lower source layer.

14. The method of claim 1, further comprising:
forming a lower source layer over the lower structure;
forming a first liner layer over the lower source layer;
forming a second liner layer over the source sacrificial layer; and
forming an upper source layer over the second liner layer,
wherein the source sacrificial layer disposed between the first liner layer and the second liner layer, and
wherein the multi-layer stack disposed on the upper source layer.

15. The method of claim 14, wherein the first liner layer, or the second liner layer, or both include a silicon oxide or a SiCO.

16. The method of claim 14, wherein the first liner layer includes a silicon oxide, and the second liner layer includes SiCO.

17. The method of claim 1, further comprising:
forming a lower source layer over the lower structure;
forming a first liner layer over the lower source layer; and
forming a second liner layer over the source sacrificial layer,
wherein the source sacrificial layer disposed between the first liner layer and the second liner layer,
wherein the multi-layer stack disposed on the second liner layer, and
wherein the first liner layer is formed of a silicon oxide, and the second liner layer is formed of SiCO.

18. A method for fabricating a semiconductor device, comprising:
forming a first multi-layer stack including a first liner layer, a second liner and a source sacrificial layer disposed between the first liner layer and the second liner layer;
forming a second multi-layer stack including dielectric layers and sacrificial layers over the first multi-layer stack;
forming a vertical contact recess extending through the second multi-layer stack and the source sacrificial layer;
replacing the source sacrificial layer with a source contact layer;
forming a sealing spacer on sidewall of the vertical contact recess;
replacing the sacrificial layers with conductive layers; and
forming a source contact plug in the vertical contact recess,
wherein the sealing spacer includes a stack of a layer of $SiO_2$ and a layer of SiCO, and the SiCO is in direct contact with the source contact plug.

19. The method of claim 18, further comprising:
after forming the second multi-layer stack,
forming a memory stack structure that includes a channel layer and a memory layer, the memory stack structure extending to penetrate through the second multi-layer stack and the source sacrificial layer.

20. The method of claim 18, wherein forming the source contact plug in the vertical contact recess comprising:
forming a silicon-containing material pattern;
forming a barrier material layer over the silicon-containing material pattern; and
forming a metal-containing material pattern over the barrier material.

* * * * *